(12) United States Patent
Ohtsuka

(10) Patent No.: US 12,362,530 B2
(45) Date of Patent: Jul. 15, 2025

(54) OPTICAL AMPLIFIER AND OPTICAL COMMUNICATION SYSTEM

(71) Applicant: SUMITOMO ELECTRIC INDUSTRIES, LTD., Osaka (JP)

(72) Inventor: Takafumi Ohtsuka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 588 days.

(21) Appl. No.: 17/808,363

(22) Filed: Jun. 23, 2022

(65) Prior Publication Data
US 2023/0006411 A1      Jan. 5, 2023

(30) Foreign Application Priority Data
Jul. 5, 2021 (JP) .................. 2021-111469

(51) Int. Cl.
*H01S 3/067* (2006.01)
*H01S 3/094* (2006.01)
*H01S 3/16* (2006.01)
*H04B 10/25* (2013.01)

(52) U.S. Cl.
CPC .... *H01S 3/06754* (2013.01); *H01S 3/094007* (2013.01); *H01S 3/1603* (2013.01); *H04B 10/25* (2013.01)

(58) Field of Classification Search
None
See application file for complete search history.

(56) References Cited

U.S. PATENT DOCUMENTS

| 2014/0307304 A1* | 10/2014 | Zhu ..................... G02B 6/02347 |
| | | 359/341.3 |
| 2019/0115715 A1 | 4/2019 | Hasegawa et al. |
| 2019/0207358 A1* | 7/2019 | Hasegawa ......... H01S 3/094065 |

FOREIGN PATENT DOCUMENTS

| JP | 2012-151313 | 8/2012 |
| JP | 2015-510253 | 4/2015 |
| JP | 2019-075450 | 5/2019 |
| WO | 2013/090549 | 6/2013 |

OTHER PUBLICATIONS

Shohei Yamaguchi et al., "The Optical Submarine Repeater and Its Associated Technologies", NEC Technical Journal vol. 62, No. Apr. 2009, pp. 20-23.
Tomoyuki Kaneko et al., "Power Feeding Equipment for Optical Submarine Cable Systems", NEC Technical Journal vol. 62, No. Apr. 2009, pp. 32-35.
Kenichi Yoneyama et al., "Construction Technology for Use in Repeatered Transoceanic Optical Submarine Cable Systems", NEC Technical Journal vol. 62, No. Apr. 2009, pp. 44-47.

* cited by examiner

*Primary Examiner* — Richard H Kim
(74) *Attorney, Agent, or Firm* — IPUSA, PLLC

(57) ABSTRACT

An optical amplifier includes one or more rare earth element-doped optical fibers each including one or more cores, two or more excitation light sources per single core of the one or more rare earth element-doped optical fibers, configured to emit excitation light for exciting a rare earth element added to the one or more rare earth element-doped optical fibers according to a driving current, and a synthesizing part configured to synthesize the excitation light emitted from the two or more excitation light sources per single core. Two or more cores are provided in total, and the excitation light emitted from the two or more excitation light (Continued)

sources per single core is synthesized and input with respect to each core.

10 Claims, 12 Drawing Sheets

FIG.3
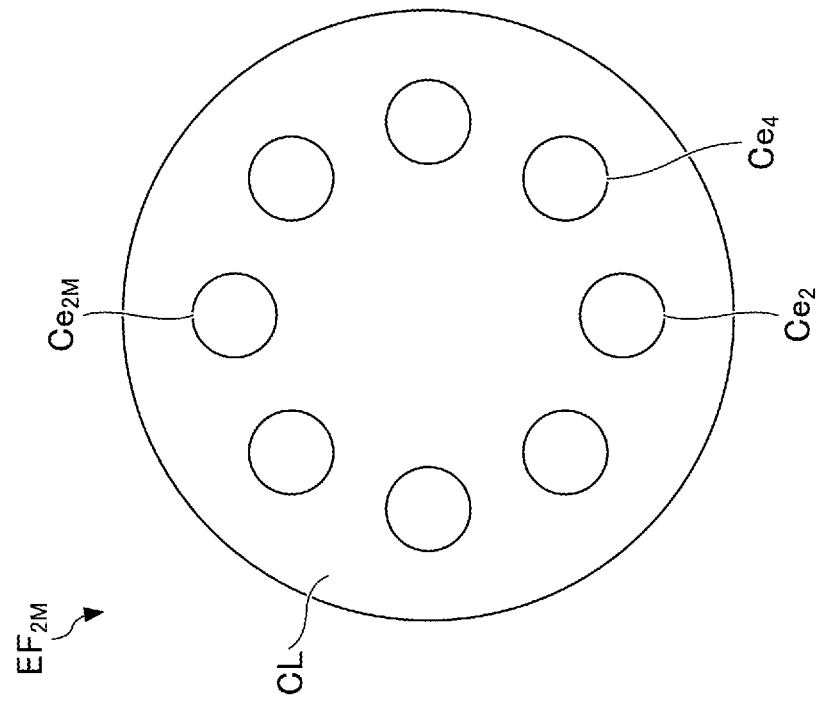
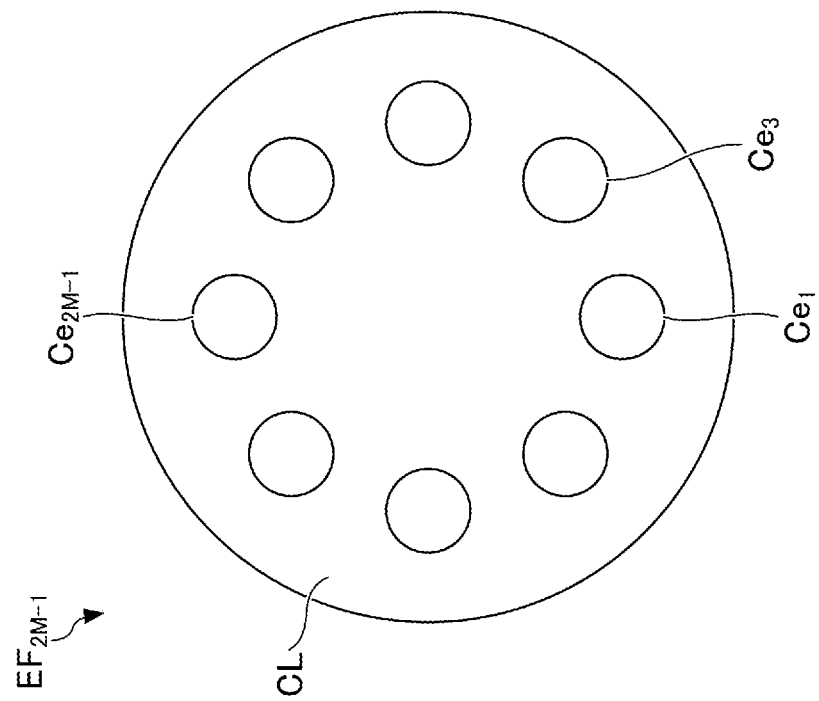

OPTICAL AMPLIFIER AND OPTICAL COMMUNICATION SYSTEM

CROSS-REFERENCE TO RELATED APPLICATIONS

This application is based upon and claims priority to Japanese Patent Application No. 2021-111469 filed on Jul. 5, 2021, the entire contents of which are incorporated herein by reference.

BACKGROUND OF THE INVENTION

1. Field of the Invention

The present disclosure relates to optical amplifiers, and optical communication systems.

2. Description of the Related Art

For example, Shohei Yamaguchi et al., "The Optical Submarine Repeater and Its Associated Technologies", NEC TECHNICAL JOURNAL Vol. 62, No. 4/2009, pp. 20-23, Tomoyuki KANEKO et al., "Power Feeding Equipment for Optical Submarine Cable Systems", NEC TECHNICAL JOURNAL Vol. 62, No. 4/2009, pp. 32-35, and Kenichi YONEYAMA et al., "Construction Technology for Use in Repeatered Transoceanic Optical Submarine Cable Systems", NEC TECHNICAL JOURNAL Vol. 62, No. 4/2009, pp. 44-47 are examples of related art describing optical communication systems including an optical submarine cable, and an optical amplifier that is supplied with power from a power supply device set up in a landing station building through a feeder line.

The optical amplifier of the optical communication systems described in such related art has a large operating current.

SUMMARY OF THE INVENTION

According to one aspect of the present disclosure, an optical amplifier G including one or more rare earth element-doped optical fibers EF each including one or more cores Cw; two or more excitation light sources L per single core Ce of the one or more rare earth element-doped optical fibers EF, configured to emit excitation light Lp for exciting a rare earth element added to the one or more rare earth element-doped optical fibers EF according to a driving current; and a synthesizing part PB configured to synthesize the excitation light Lp emitted from the two or more excitation light sources L per single core Ce, wherein two or more cores Ce are provided in total, and the excitation light Lp emitted from the two or more excitation light sources L per single core Ce is synthetized and input with respect to each core Ce.

Other objects and further features of the present disclosure will be apparent from the following detailed description when read in conjunction with the accompanying drawings.

BRIEF DESCRIPTION OF THE DRAWINGS

FIG. 3 is a cross sectional view illustrating an example of a configuration of erbium-doped optical fibers;

DESCRIPTION OF THE EMBODIMENTS

Figure 1:
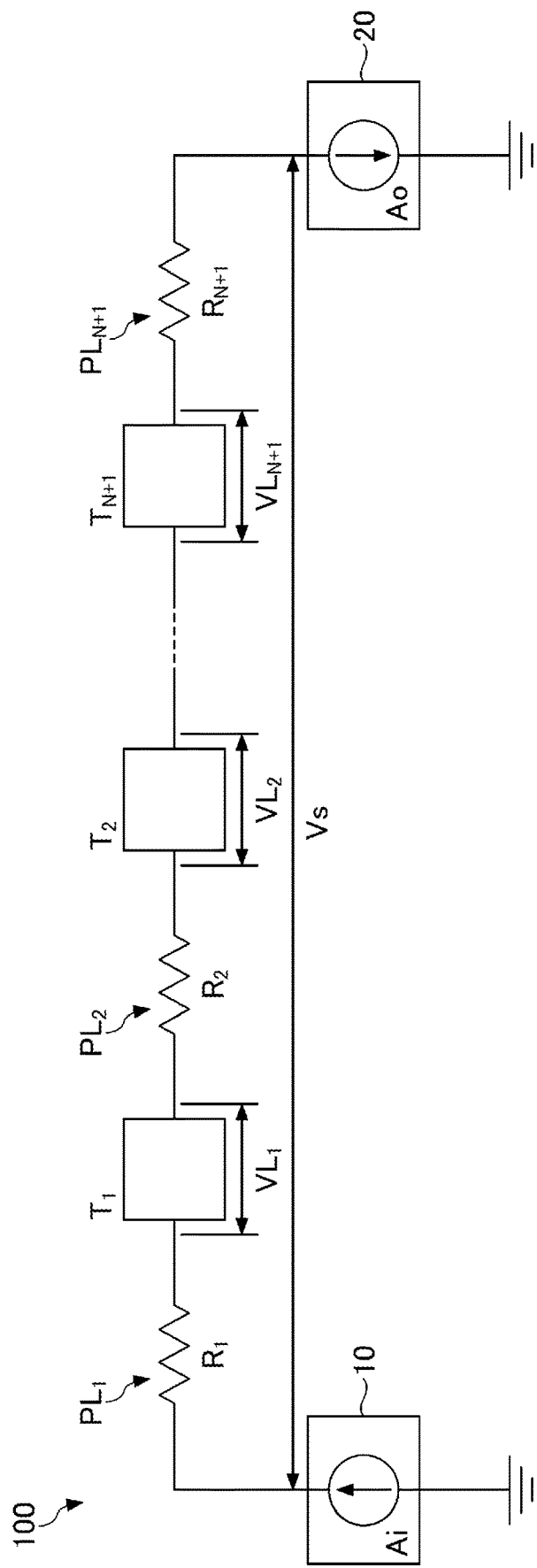
FIG. 1 is an equivalent circuit diagram illustrating an example of a power supply configuration of an optical communication system according to one embodiment.

Embodiments of the present disclosure will be described in the following. In the following description, the same or corresponding elements are designated by the same reference numerals, and a description of the same or corresponding elements will be omitted.

The optical amplifier of the optical communication systems described in the related art described above has a large operating current, and a resistance loss of the optical communication systems increases according to the operating current of the optical amplifier. For this reason, the optical amplifier is required to have a low operating current.

One object of the present disclosure is to provide an optical amplifier having a low operating current.

First, embodiments of the present disclosure will be described in the following. An optical amplifier according to one aspect of the present disclosure includes one or more rare earth element-doped optical fibers each including one or more cores, two or more excitation light sources per single core of the one or more rare earth element-doped optical fibers, configured to emit excitation light for exciting a rare earth element added to the one or more rare earth element-doped optical fibers according to a driving current, and a synthesizing part configured to synthetize the excitation light emitted from the two or more excitation light sources per single core. Two or more cores are provided in total, and the excitation light emitted from the two or more excitation light sources per single core is synthesized and input with respect to each core.

When a number exceeding one per single core is denoted by K, the light emitted from each of the K excitation light sources of the optical amplifier is synthesized and input to one core to excite this one core. This configuration enables the driving current of the excitation light source, required to obtain the optical power to excite this one core, to be approximately 1/K, thereby providing the optical amplifier having a low operating current.

The optical amplifier refers to an amplifier that does not convert an optical signal into an electrical signal, but directly amplifies the optical signal in a light state. The one or more rare earth element-doped optical fibers each including one or more cores, include a single rare earth element-doped optical fiber having a single core, a single rare earth element-doped optical fiber having multiple cores, multiple rare earth element-doped optical fibers respectively having a single core, multiple rare earth element-doped optical fibers respectively having multiple cores, or the like. The rare earth element-doped optical fibers having multiple cores include coupled multicore optical fibers, few-mode optical fibers, uncoupled multicore optical fibers, or the like. In the following description, the term "multicore optical fiber" refers to at least one of the coupled multicore optical fiber, the few-mode optical fiber, and the uncoupled multicore optical fiber.

The number K exceeding one per single core refers to an integer or a decimal. For example, in a case where the optical amplifier described above includes 4 excitation light sources per two cores, the number K exceeding one per single core is 2. In a case where the optical amplifier described above includes 3 excitation light sources per two cores, the number K exceeding one per single core is 1.5.

The operating current of the optical amplifier refers to a current used to operate the optical amplifier to obtain a desired amplification factor. The driving current for driving the excitation light source is at least a portion of the operating current of the optical amplifier. As the driving current becomes smaller, the operating current of the optical amplifier becomes smaller.

In the optical amplifier described above, the two or more excitation light sources per single core are driven by the driving currents supplied from a plurality of driving circuits connected in series. For example, in a case where the driving currents are supplied to K excitation light sources, and K driving circuits are connected in parallel, because approximately the same driving current I needs to be supplied to each of the K driving circuits, a total of K×I driving currents are required, to thereby increase the operating current of the optical amplifier. Because the K driving circuits are connected in series, the K driving circuits in their entirety can be driven by the driving current I, and the driving current can be reduced to approximately 1/K compared to the case where K driving circuits are connected in parallel.

In the optical amplifier described above, the synthesizing part may synthesize the excitation light emitted from the two or more excitation light sources per single core, according to at least one of synthesizing methods including a polarization synthesizing method, a light injection synchronization method, a complex resonator method, and a master oscillator power amplifier (MOPA) method. The optical amplifier described above can synthesize the excitation light emitted from the two or more excitation light sources per single core, according to any one of the synthesizing methods, or according to a combination of at least two of the synthesizing methods.

The polarization synthesizing method refers to a method of synthesizing a plurality of different polarizations, using a polarizing element, such as a polarizing beam splitter (PBS) or the like. The polarization refers to an electromagnetic wave, such as light, radio wave, or the like having a regular direction of oscillation of electric and magnetic fields. The light injection synchronization method refers to a method of synthesizing a plurality of different light, using a light injection synchronization phenomenon. The light injection synchronization phenomenon refers to a phenomenon in which an oscillation wavelength of a semiconductor laser is synchronized to a wavelength of external light, when the external light having the wavelength close to the oscillation wavelength is input to the self-oscillating semiconductor laser.

The complex resonator method refers to a method of synthesizing a plurality of different light, using a complex resonator. The complex resonator refers to a resonator having a plurality of resonators connected along a predetermined direction. The MOPA method refers to a method of synthesizing a plurality of different light, using a MOPA. The MOPA independently controls a first main oscillator (or seed light) and a second high-output oscillator, and extracts from the second oscillator high-output light in which the light emitted from the first oscillator and the second oscillator are synthesized.

In the optical amplifier described above, the two or more excitation light sources per single core may include, in at least a portion thereof, a semiconductor laser group including a plurality of semiconductor lasers connected in series, and the plurality of semiconductor lasers included in the semiconductor laser group may be driven by a common driving current. To "include, in at least a portion thereof, a semiconductor laser group", that is, including the semiconductor laser group in at least a portion of the two or more excitation light sources per single core, includes both a case where the two or more excitation light sources per single core are formed by a plurality of the semiconductor laser groups, and a case where the semiconductor laser group is included in a portion of the two or more excitation light sources per single core.

For example, in a case where the driving circuit for driving the excitation light source includes a current source, because the current source includes a resistor, a voltage drop becomes large as the number of driving circuits becomes large, thereby increasing the operating current of the optical amplifier. On the other hand, the optical amplifier described above can reduce the number of driving circuits in correspondence with the number of semiconductor laser groups, by driving the plurality of semiconductor lasers included in the semiconductor laser group using the common driving current. For this reason, it is possible to reduce the voltage drop, and make the operating current of the optical amplifier small. In addition, the optical amplifier described above can also make an area in which the driving circuits are disposed small, by reducing the number of driving circuits.

In the optical amplifier described above, the rare earth element-doped optical fiber is preferably a multicore optical fiber having a plurality of cores covered with a single cladding. This is because, when the optical amplifier includes the multicore optical fiber, the number of cores included in the optical amplifier increases, and as the number of cores increases, the effect of reducing the operating current of the optical amplifier per single core becomes large.

In the case where the rare earth element-doped optical fiber is the coupled multicore optical fiber, a power coupling coefficient between adjacent cores among the plurality of cores is preferably 10 [/m] or higher. In the optical amplifier having the rare earth element-doped optical fiber having practical properties, a length of the rare earth element-doped optical fiber is approximately 10 [m] or greater. In this case, it is possible to sufficiently reduce a mode dependent gain (MDG), using the coupled multicore optical fiber with the power coupling coefficient between the adjacent cores of 10 [/m] or higher. Due to a redundancy obtained by reducing the MDG, the optical amplifier described above can reduce a difference in gains between modes, even when the optical power of the excitation light input to each of the cores greatly deviates from an optimum state.

The power coupling coefficient refers to a power ratio between powers of light to be synthesized to light propagating in a waveguide mode other than a predetermined waveguide mode, and light propagating in the predetermined waveguide mode, among the light propagating in the predetermined waveguide mode. The power coupling function can be defined as a coefficient of a power coupling equation, where [m] a unit indicating meters, and [/m] is a unit indicating an inverse of meters. In the following description, alphabets indicated in square brackets "[ ]" refer to a unit.

Moreover, an optical communication system according to another aspect of the present disclosure includes one or more optical fibers configured to transmit optical signals, and the optical amplifier described above configured to amplify the optical signals transmitted through the one or more optical fibers. In this optical communication system, by providing the optical amplifier described above, the operating current of the optical amplifier can be made small, and a resistance loss of the optical communication system can be made small. Further, it is possible to reduce a temperature rise of the elements, such as the excitation light source and a power transistor in the optical amplifier, and extend a serviceable life of each of the elements.

DETAILS OF EMBODIMENTS OF PRESENT DISCLOSURE

Specific examples of the optical amplifier according to embodiments of the present disclosure will be described, with reference to the accompanying drawings. The present invention is not limited to these examples, and various variations, modifications, and substitutions may be made within the scope of the present invention recited in the claims and equivalents thereof. In the following description, those elements that are the same or have the same functions will be designated by the same reference numerals, and a repeated description thereof will be omitted.

EMBODIMENTS

[Configuration of Optical Communication System 100]

An optical communication system 100 according to one embodiment of the present disclosure, including an optical amplifier G, will be described. The optical communication system 100 may be an optical submarine cable system that is provided across the Pacific Ocean, using an optical submarine cable, and configured to perform a long-distance optical communication between Japan and the United States, for example. The optical communication system 100 includes one or more optical fibers for transmitting optical signals, and the optical amplifier G for amplifying optical signals transmitted through the one or more optical fibers.

The one or more optical fibers are provided inside the optical submarine cable. In the optical communication system 100, in order to compensate for a transmission loss of the optical signals transmitted through the one or more optical fibers, a plurality of relays is disposed at a seabed in a transmission path of the one or more optical fibers. The optical amplifier G is provided in each of the plurality of repeaters.

FIG. 1 is an equivalent circuit diagram illustrating an example of a power supply configuration of the optical communication system 100 for supplying power to each of the plurality of repeaters. The optical communication system 100 includes, as a power supply system (or feeder system), a first power supply device (or first feeder device) 10, a second power supply device (or second feeder device) 20, and feeder lines $PL_1$ through $PL_{N+1}$, where N is a natural number, and suffixes or subscripts of the feeder lines $PL_1$ through $PL_{N+1}$ are used to distinguish each of the N+1 feeder lines. In the following description, when not specifically distinguishing the N+1 feeder lines from one another, the suffixes or subscripts may be omitted, to thereby refer to the feeder lines by a generic representation "PL". The same applies to the suffixes or subscripts used for repeaters T, optical amplifiers G, semiconductor lasers L, driving circuits D, erbium-doped optical fibers EF, or the like that are described in the following.

In the optical communication system, in order to improve a reliability of the power supply system, a power supply device capable of supplying the required power is set up in each of a plurality of landing stations. The landing station refers to a point where the optical submarine cables disposed at the seabed is routed aboveground.

In the optical communication system 100, the first power supply device 10 is provided in a first landing station (for example, in Japan), and supplies a direct current (DC) constant current from a DC current source Ai with respect to the repeater. The second power supply device 20 is provided in a second landing station (for example, in the United States), and supplies a DC constant current a DC current source Ao with respect to the repeater. Sea earth or sea ground is provided for each of the first power supply device 10 and the second power supply device 20. The optical communication system 100 can supply power from both stations, by sharing the power supply between the first landing station and the second landing station.

The feeder lines $PL_1$ through $PL_{N+1}$ are a transmission paths for transmitting the power supplied from each of the first power supply device 10 and the second power supply device 20 to each of the repeaters $T_1$ through $T_{N+1}$ connected in series.

A voltage Vs represents a voltage supplied to the repeaters $T_1$ through $T_{N+1}$ in their entirety. Voltages $VL_1$ through $VL_{N+1}$ represent voltages supplied to the repeaters $T_1$ through $T_{N+1}$, respectively. Resistors $R_1$ through $R_{N+1}$ represent electrical resistances of the feeder lines $PL_1$ through $PL_{N+1}$, respectively.

In the optical submarine cable system, such as optical communication system 100, a resistance loss is generated by the resistances of the resistors $R_1$ through $R_{N+1}$ or the like. Because the resistance loss is proportional to the square of the current, it is preferable to reduce the current that is supplied. However, in the optical submarine cable system, there is a limit to adjusting a ratio between the voltage and the current because a DC power supply is performed with respect to the repeater, and the current required in the repeater needs to flow through the feeder line. Accordingly, in order to reduce the resistance loss of the optical submarine cable system, the optical amplifier included in the repeater is required to have a low operating current.

First Embodiment

[Configuration of Optical Amplifier G]

Figure 2:
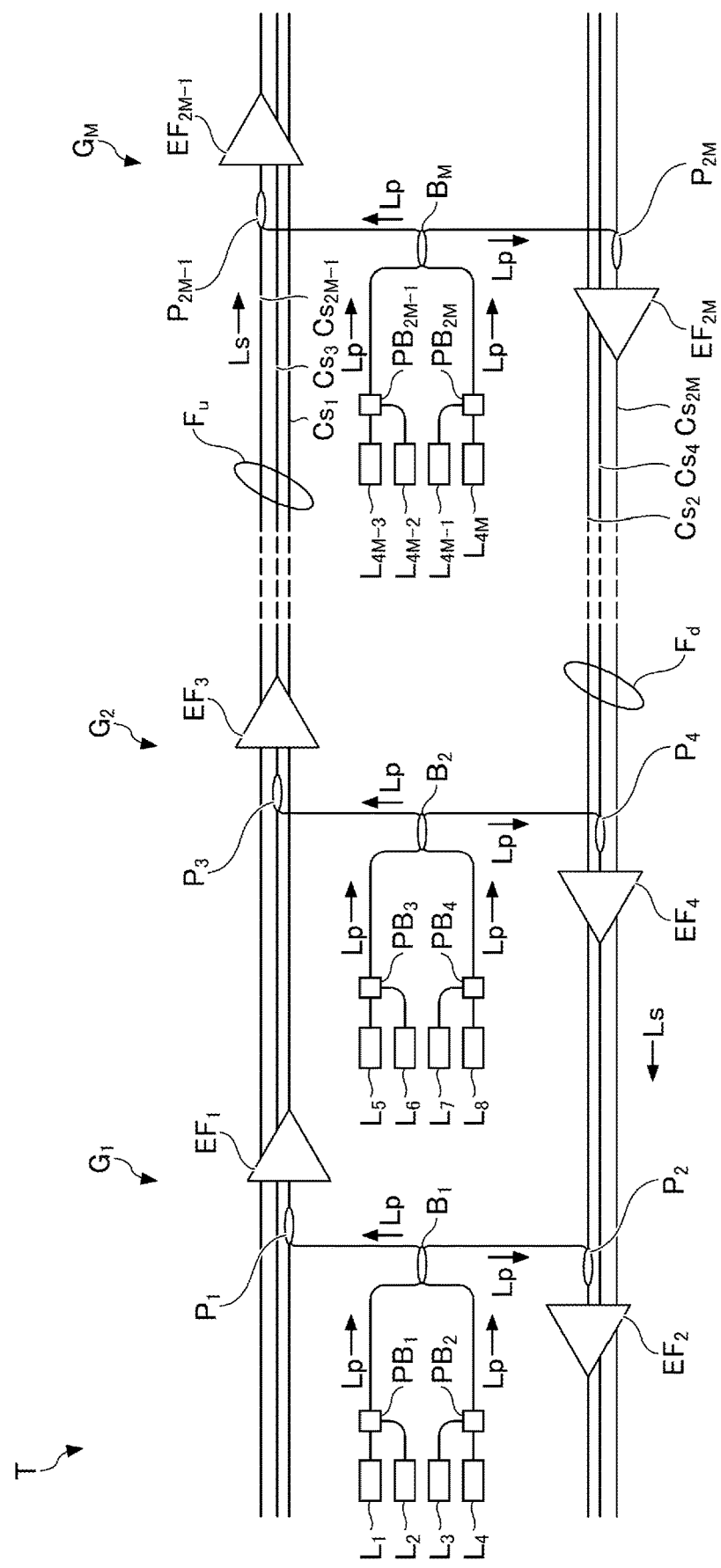
FIG. 2 is a diagram illustrating an example of a configuration of an optical amplifier according to a first embodiment.

The configuration of the optical amplifier G will be described, with reference to FIG. 2 and FIG. 3. FIG. 2 is a diagram illustrating an example of the configuration of the optical amplifier G included in the repeater T of the optical communication system 100. FIG. 3 is a cross sectional view illustrating an example of a configuration of the erbium-doped optical fibers EF including the optical amplifier G. The cross sectional view of FIG. 3 corresponds to a view of the erbium-doped optical fibers EF when the erbium-doped optical fibers EF are cut along a plane approximately perpendicular to a light transmission direction and viewed in the light transmission direction.

As illustrated in FIG. 2, the repeater T includes M optical amplifiers G, including an optical amplifier $G_1$, an optical amplifier $G_2$, ..., and an optical amplifier $G_M$. The repeaters $T_1$ through $T_{N+1}$ illustrated in FIG. 1 have the same configuration as the repeater T illustrated in FIG. 2. M is a natural number representing the number of cores (hereinafter also referred to as "signal cores") for transmitting optical signals, included in optical fibers for either upstream (or uplink) transmission of the optical signals from the first landing station to the second landing station or downstream (or downlink) transmission of the optical signals from the second landing station to the first landing station. In the present embodiment, M is 8. However, the value of M is not limited to 8, and the value of M can be modified, as appropriate.

The repeater T is connected to an upstream optical fiber Fu for the upstream transmission of the optical signals from the first landing station to the second landing station, and a downstream optical fiber Fd for the downstream transmission of the optical signals from the second landing station to the first landing station. The upstream optical fiber Fu is a multicore optical fiber having 8 signal cores Cs, including a signal core $Cs_1$, a signal core $Cs_3$, ..., and a signal core $Cs_{2M-1}$ (odd-numbered signal cores Cs), covered with a single cladding. The downstream optical fiber Fd is a multicore optical fiber having 8 signal cores Cs, including a signal core $Cs_2$, a signal core $Cs_4$, ..., and a signal core $Cs_{2M}$ (even-numbered signal cores Cs), covered with a single cladding. The upstream optical fiber Fu and the downstream optical fiber Fd transmit signal light Ls having a wavelength of approximately 1550 [nm], for example, as the optical signal. However, the wavelength of the signal light Ls is not limited to approximately 1550 [nm], and can be modified, as appropriate.

The optical amplifier G amplifies the signal light Ls transmitted from the first landing station to the repeater T through the upstream optical fiber Fu, and outputs the amplified signal light Ls to the second landing station through the upstream optical fiber Fu. The optical amplifier G amplifies the signal light Ls transmitted from the second landing station to the repeater T through the downstream optical fiber Fd, and outputs the amplified signal light Ls to the first landing station through the downstream optical fiber Fd.

In FIG. 2, the optical amplifier G includes the erbium-doped optical fibers EF, the semiconductor lasers L, and the polarization elements PB. More specifically, the optical amplifier $G_1$ includes the erbium-doped optical fiber $EF_1$, the erbium-doped optical fiber $EF_2$, 4 semiconductor lasers L including the semiconductor lasers $L_1$ through $L_4$, and two polarization elements PB including the polarization elements $PB_1$ and $PB_2$. The optical amplifier $G_2$ includes the erbium-doped optical fiber $EF_3$, the erbium-doped optical fiber $EF_4$, 4 semiconductor lasers L including the semiconductor lasers $L_5$ through $L_8$, and two polarization elements PB including the polarization elements $PB_3$ and $PB_4$. The optical amplifier $G_M$ includes the erbium-doped optical fiber $EF_{2M-1}$, the erbium-doped optical fiber $EF_{2M}$, 4 semiconductor lasers L including the semiconductor lasers $L_{4M-3}$ through $L_{4M}$, and two polarization elements PB including the polarization elements $PB_{2M-1}$ and $PB_{2M}$.

The erbium-doped optical fibers EF are an example of one or more rare earth element-doped optical fibers each including one or more cores. A core (hereinafter also referred to as "excitation core") Ce in which the signal light is amplified in the rare earth element-doped optical fiber EF is an example of one or more cores included in the rare earth element-doped optical fiber EF.

As illustrated in FIG. 3, the erbium-doped optical fiber $EF_{2M-1}$ and the erbium-doped optical fiber $EF_{2M}$ are multicore optical fibers each having 8 excitation cores Ce covered with a single cladding CL. The erbium-doped optical fibers EF1 through $EF_{2M}$ of the erbium-doped optical fibers EF all have the same configuration.

In the present embodiment, the upstream optical fiber Fu and the downstream optical fiber Fd are also multicore optical fibers each having 8 signal cores Cs covered with a single cladding CL. The present embodiment illustrates an example of the configuration in which the number of signal cores Cs is the same as the number of excitation cores Ce, but the number of signal cores Cs and the number of excitation cores Ce do not necessarily have to be the same.

The erbium-doped optical fiber $EF_{2M-1}$ includes 8 excitation cores Ce including the excitation cores $Ce_1$ through $Ce_{2M-1}$, and amplifies the signal light Ls transmitted through the odd-numbered signal cores $Cs_1$ through $Cs_{2M-1}$, respectively. The erbium-doped optical fiber $EF_{2M}$ includes 8 excitation cores Ce including the excitation cores $Ce_2$ through $Ce_{2M}$, and amplifies the signal light Ls transmitted through the even-numbered signal cores $Cs_2$ through $Cs_{2M}$, respectively. When a coupled multicore optical fiber is used as the erbium-doped optical fiber EF, the power coupling coefficient between adjacent excitation cores Ce among the plurality of excitation cores Ce is preferably 10 [/m] or higher.

In FIG. 2, the semiconductor laser L is an example of an excitation light source that emits excitation light Lp for exciting the erbium added to the erbium-doped optical fiber EF, according to the driving current. The semiconductor laser L emits the excitation light Lp having a wavelength of approximately 1480 [nm] or approximately 980 [nm], for example, that can excite the erbium. However, the excitation light source is not limited to the semiconductor laser L, and may be other types of light sources capable of emitting the excitation light having the waveform that can excite the erbium.

In the present embodiment, the optical amplifier G includes two semiconductor lasers L per single excitation core Ce of the erbium-doped optical fiber EF. More particularly, the optical amplifier G includes 16 excitation cores Ce of the erbium-doped optical fibers EF, in order to amplify the signal light Ls transmitted through a total of 16 signal cores Cs included the upstream optical fiber Fu and the downstream optical fiber Fd, respectively. In addition, the optical amplifier G includes two semiconductor lasers L per single excitation core Ce of the erbium-doped optical fiber EF, that is, a total of 32 semiconductor lasers L.

The semiconductor laser $L_1$ and the semiconductor laser $L_2$ excite the erbium added to the excitation core $Ce_1$. The semiconductor laser $L_3$ and the semiconductor laser $L_4$ excite the erbium added to the excitation core $Ce_2$. The semiconductor laser $L_5$ and the semiconductor laser $L_6$ excite the erbium added to the excitation core $Ce_3$. The semiconductor laser $L_7$ and the semiconductor laser $L_8$ excite the erbium added to the excitation core $Ce_4$. The semiconductor laser $L_{4M-3}$ and the semiconductor laser $L_{4M-2}$ excite the erbium added to the excitation core $Ce_{2M-1}$. The semiconductor laser $L_{4M-1}$ and the semiconductor laser $L_{4M}$ excite the erbium added to the excitation core $Ce_{2M}$.

In the optical amplifier $G_1$, the excitation light Lp emitted from the semiconductor laser $L_1$ and the excitation light Lp emitted from the semiconductor laser $L_2$ are input to the polarization element $PB_1$, respectively. The polarization element $PB_1$ is an example of a synthesizing part that synthesizes the excitation light Lp emitted from the two semiconductor lasers $L_1$ and $L_2$ per single excitation core Ce. The method of synthesizing the excitation light Lp by the polarization element $PB_1$ corresponds to the polarization synthesizing method.

The polarization element $PB_1$ is a polarization beam splitter including an optical surface that transmits a P-polarization component and reflects an S-polarization component. The polarization element $PB_1$ transmits the excitation light Lp that is linearly polarized light of the P-polarization emitted from the semiconductor laser $L_1$, and reflects the excitation light Lp that is linearly polarized light of the S-polarization emitted from the semiconductor laser $L_2$, for example, so as to synthesize the two excitation light Lp. The polarization element $PB_1$ utilizes polarization to efficiently synthesize the excitation light Lp emitted from the semiconductor laser $L_1$ and the semiconductor laser $L_2$, respectively. The excitation light Lp emitted from the semiconductor laser L is not limited to the linearly polarized light, and may be elliptically polarized light or the like. However, from a viewpoint of reducing the optical loss, the excitation light Lp emitted from the semiconductor laser L is preferably the linearly polarized light.

Similarly, the excitation light Lp emitted from the semiconductor laser $L_3$ and the excitation light Lp emitted from the semiconductor laser $L_4$ are input to the polarization element $PB_2$, respectively, and synthesized by the polarization element $PB_2$.

The excitation light Lp synthesized by the polarization element $PB_1$ and the excitation light Lp synthesized by the polarization element $PB_2$ are input to a 3 dB coupler $B_1$, respectively. The 3 dB coupler $B_1$ is a passive optical element that synthesizes two light input thereto, and thereafter branches the synthesized light into two so that a branching ratio is approximately 1:1. One of the two excitation light Lp branched by 3 dB coupler $B_1$ is guided toward an optical fiber pump multiplexer $P_1$, and is thereafter input to the optical fiber pump multiplexer $P_1$.

The optical fiber pump multiplexer $P_1$ is a wavelength division multiplexing (WDM) coupler, for example. One of the two excited light Lp branched by the 3 dB coupler $B_1$ is combined or multiplexed with the signal light Ls transmitted through the signal core $Cs_1$, by the action of the optical fiber pump multiplexer $P_1$, and the multiplexed light is input to the excitation core $Ce_1$ of the erbium-doped optical fiber $EF_1$ together with the signal light Ls.

In other words, the excitation light L, including the excitation light Lp emitted from the semiconductor laser $L_1$, and the excitation light Lp emitted from the semiconductor laser $L_2$, are synthesized by the polarization element $PB_1$, and thereafter input with respect to the excitation core $Ce_1$ through the optical fiber pump multiplexer $P_1$.

The erbium-doped optical fiber $EF_1$ forms a population inversion by the erbium that is added to the excitation core $Ce_1$ and is excited by the input excitation light Lp. The erbium-doped optical fiber $EF_1$ causes stimulated emission and amplification of the signal light Ls transmitted through the erbium-doped optical fiber $EF_1$, due to erbium ions in the population inversion state. The amplified signal light Ls is transmitted again through the signal core $Cs_1$ toward the second landing station.

On the other hand, the other of the two excitation light Lp branched by the 3 dB coupler $B_1$ is input to an optical fiber pump multiplexer $P_2$, combined or multiplexed with the signal light Ls transmitted through the signal core $Cs_2$, and the multiplexed light is thereafter input to the excitation core $Ce_2$ of the erbium-doped optical fiber $EF_2$ together with the signal light Ls.

The erbium-doped optical fiber $EF_2$ forms a population inversion by the erbium that is added to the excitation core $Ce_2$ and is excited by the input excitation light Lp. The erbium-doped optical fiber $EF_2$ causes stimulated emission and amplification of the signal light Ls transmitted through the erbium-doped optical fiber $EF_2$, due to erbium ions in the population inversion state. The amplified signal light Ls is transmitted again through the signal core $Cs_2$ toward the first landing station.

The optical amplifier $G_1$ provides redundancy of the trunk or transit connection by the repeaters T, by amplifying the signal light Ls transmitted through the signal core $Cs_1$ included in the upstream optical fiber Fd, and the signal light Ls transmitted through the signal core $Cs_2$ included in the downstream optical fiber Fd, in pairs. In other words, even in a case where portion of the semiconductor lasers $L_1$ through $L_4$ becomes unable to emit the excited light Lp due to a failure or the like, the optical amplifier $G_1$ can distribute the impact of the failure or the like, and prevent a portion of the optical signal transmitted through the upstream optical fiber Fu and the downstream optical fiber Fd from not being amplified.

Similarly, the optical amplifier $G_2$ amplifies the signal light Ls transmitted through the signal core $Cs_3$ and the signal core $Cs_4$, by the excitation light Lp emitted from the semiconductor lasers L including the semiconductor lasers $L_5$ through $L_8$. The optical amplifier $G_M$ amplifies the signal light Ls transmitted through the signal core $Cs_{2M-1}$ and the signal core $Cs_{2M}$, by the excitation light Lp emitted from the semiconductor lasers L including the semiconductor lasers $L_{4M-3}$ through $L_{4M}$.

The configuration and function of the optical amplifiers $G_2$ through $G_M$ are the same as the configuration and function of the optical amplifier $G_1$, except for the different signal cores Cs that are targets of the optical amplification.

[Example of Configuration of Driving Circuit D of Semiconductor Laser L]

Figure 4:
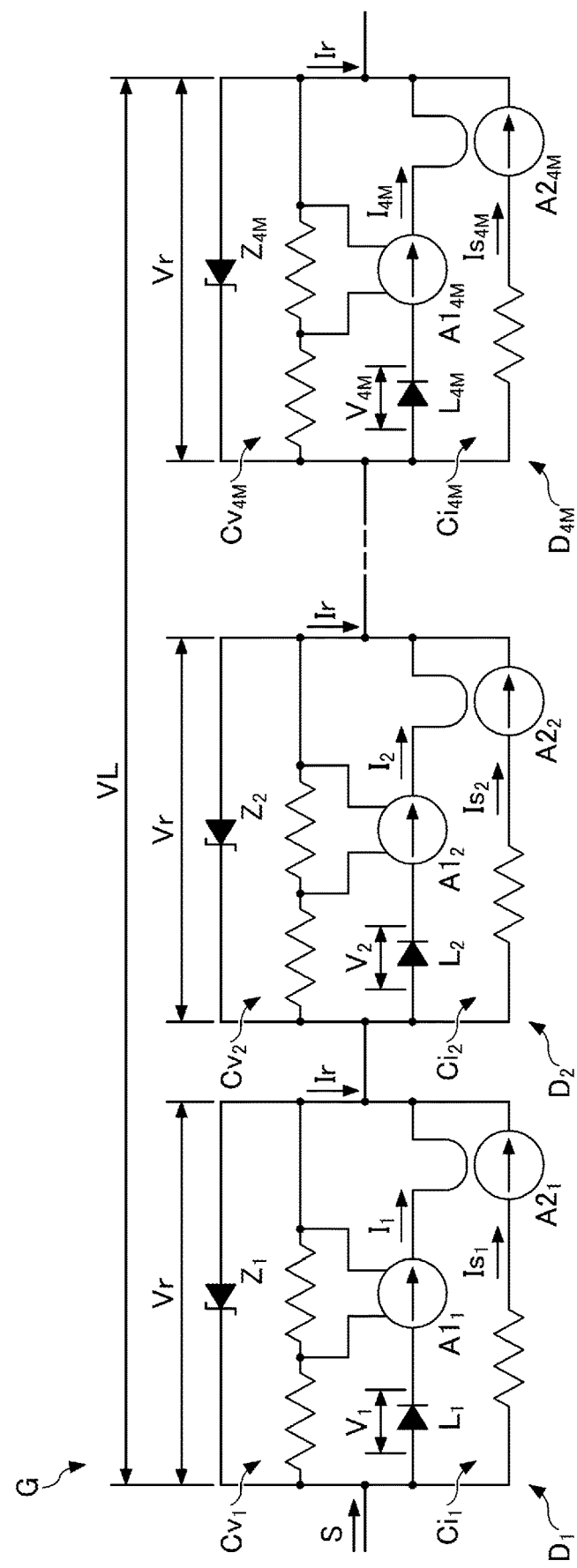
FIG. 4 is an equivalent circuit diagram of a semiconductor laser driving circuit of the optical amplifier according to the first embodiment.

FIG. 4 is an equivalent circuit diagram illustrating an example of a configuration of the driving circuit D for driving the semiconductor laser L included in the optical amplifier G. The optical amplifier G includes 32 driving circuits D including the driving circuits $D_1$ through $D_{4M}$ for driving 32 semiconductor lasers L including the semiconductor lasers $L_1$ through $L_{4M}$, where M=8. The driving circuits $D_1$ through $D_{4M}$ are connected in series. The driving circuits $D_1$ through $D_{4M}$ drive and cause emission from each of the semiconductor lasers L including the semiconductor lasers $L_1$ through $L_{4M}$, according to the driving current I that is at least a portion of an operating current S supplied from the first power supply device 10. The voltages VL represent the voltages supplied to the repeaters T.

In FIG. 4, the driving circuit $D_1$ includes a constant voltage circuit $Cv_1$, and a constant current circuit $Ci_1$. The constant voltage circuit $Cv_1$ includes a zener diode $Z_1$, and performs a constant voltage control so that a reference voltage Vr applied to the driving circuit $D_1$ becomes approximately constant.

The constant current circuit $Ci_1$ includes a current source $A1_1$, and a current source $A2_1$, and pertains a constant current control so that a current flowing through the driving circuit $D_1$ becomes approximately constant. The current source $A1_1$ is connected in series with the semiconductor laser $L_1$, and supplies a current so that a driving current $I_1$ flowing through the semiconductor laser $L_1$ becomes approximately constant. The current source $A1_2$ is connected in parallel to the semiconductor laser $L_1$, and supplies a current so that a current $Is_1$ flowing through other than the semiconductor laser $L_1$ in the driving circuit $D_1$ becomes approximately constant. The driving current $I_1$, the current $Is_1$, and a reference current Ir flowing through the constant voltage circuit $Cv_1$ are combined after flowing through the driving circuit $D_1$, and then supplied to the driving circuit $D_2$ as the operating current S. A sum of the reference current Ir, the driving current $I_1$, and the current $Is_1$ is approximately equal to the operating current S.

The configuration and function of the driving circuits $D_2$ through $D_{4M}$ are the same as the configuration and function of the driving circuit $D_1$, except for the different semiconductor lasers L that are targets to be driven.

[Functions and Effects of Optical Amplifier G]

As described above, the optical amplifier G according to the present embodiment includes one erbium-doped optical fiber EF (rare earth element-doped optical fiber) including 8 excitation cores Ce, and two semiconductor lasers L (excitation light sources) per single excitation core Ce of the erbium-doped optical fiber EF, configured to the excitation light Lp that excites the erbium (rare earth element) added to the erbium-doped optical fiber EF according to the driving current. In addition, the optical amplifier G includes the polarization element PB (synthesizing part) configured to synthesize the excitation light Lp emitted from each of the two semiconductor lasers L per single excitation core Ce. There are a total of 8 excitation cores Ce, and for each of the 8 excitation cores Ce, the excitation light Lp emitted from each of the two semiconductor lasers L per single excitation core Ce are synthesized and input.

The optical amplifier G drives both the two semiconductor lasers L by the driving current I, and excites one excitation core Ce by the excitation light Lp in which the excitation light Lp from each of the two semiconductor lasers L are synthesized. For this reason, the optical amplifier G can make the driving current I approximately ½ compared to the case where one excitation core is excited by the excitation light emitted from one semiconductor laser. By reducing the driving current I, it is possible to provide an optical amplifier having a low operating current.

Figure 5:
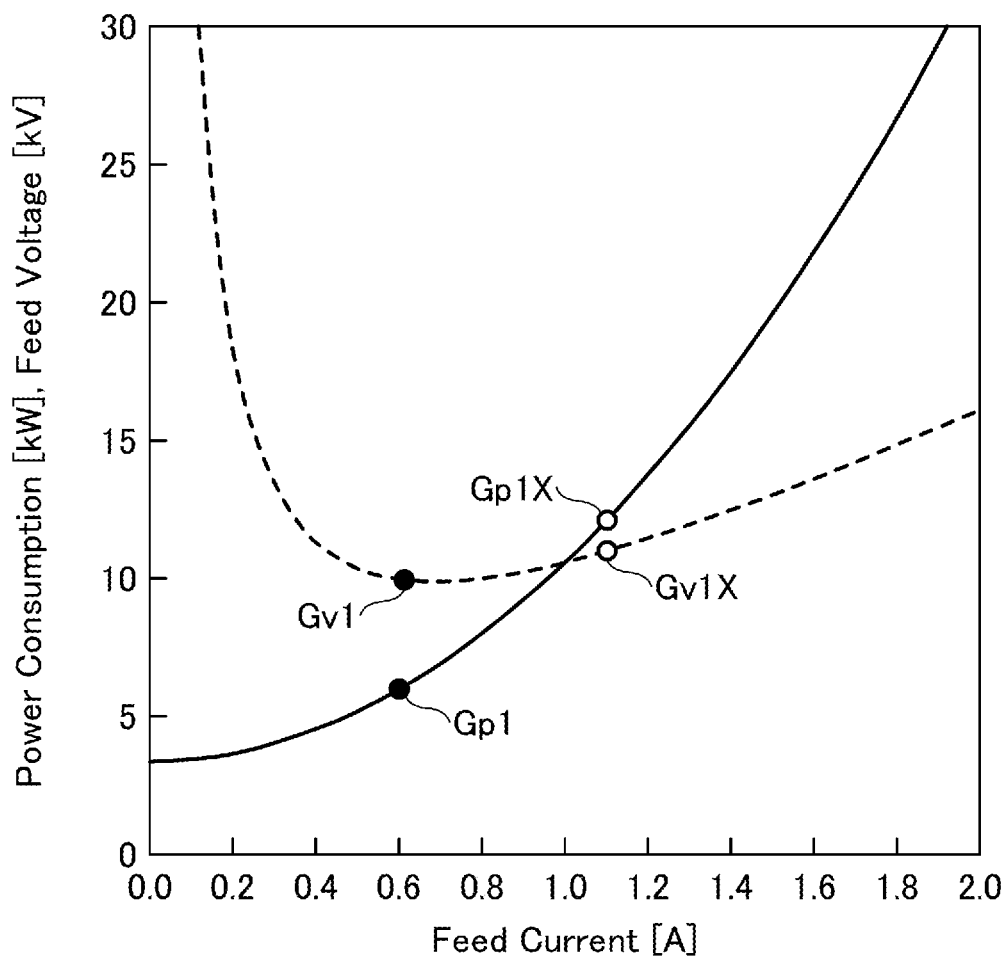
FIG. 5 is a diagram illustrating a first example of a relationship of an operating current of the optical amplifier, a power consumption or the like of the optical communication system, and a supplied voltage.
Figure 6:
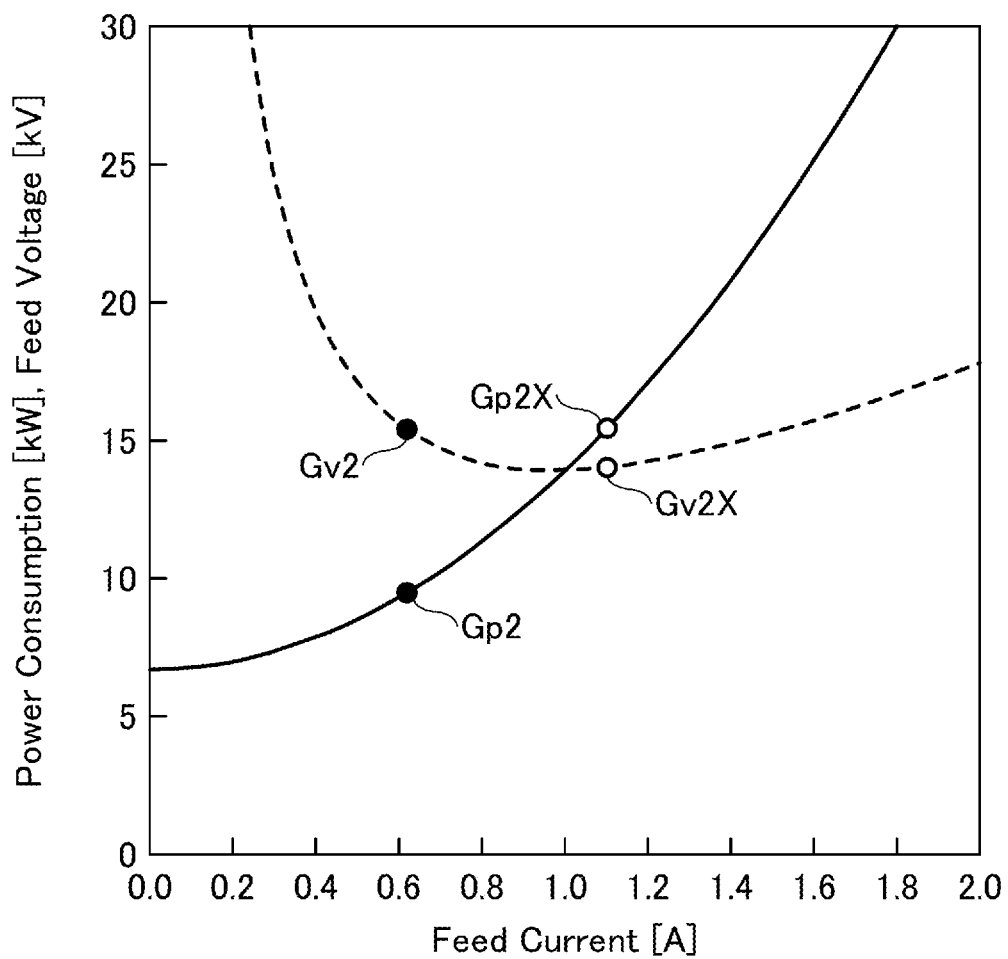
FIG. 6 is a diagram illustrating a second example of the relationship of the operating current of the optical amplifier, the power consumption or the like of the optical communication system, and the supplied voltage.

FIG. 5 and FIG. 6 illustrate simulation results indicating a relationship of the operating current of the optical amplifier, to a power consumption of the optical communication system and the voltage supplied to the optical communication system. FIG. 5 illustrates a case where the number of excitation cores Ce is 4, and FIG. 6 illustrates a case where the number of excitation cores Ce is 8.

The abscissa of FIG. 5 and FIG. 6 indicates the operating current [A] of the optical amplifier, and the ordinate indicates the power consumption [kW] and the supplied voltage [kV]. Further, the graph indicated by a dashed line in FIG. 5 and FIG. 6 represents the supplied voltage, and the graph indicated by a solid line represents the power consumption.

In FIG. 5, a power consumption Gp1X denotes the power consumption of an optical amplifier GX according to a comparative example, and a supplied voltage Gv1X denotes the supplied voltage to the optical amplifier GX according to the comparative example. The comparative example relates to a result of a simulation based on numerical conditions described in the examples of the related art described above. The power consumption Gp1 represents the power consumption of the optical amplifier G according to the present embodiment, and the supplied voltage Gv1 represents the supplied voltage to the optical amplifier G according to the present embodiment.

Similarly, in FIG. 6, the power consumption Gp2X represents the power consumption of the optical amplifier GX according to the comparative example, and the supplied voltage Gv2X represents the supplied voltage to the optical amplifier GX according to the comparative example. The power consumption Gp2 represents the power consumption of the optical amplifier G according to the present embodiment, and the supplied voltage Gv2 represents the supplied voltage to the optical amplifier G according to the present embodiment.

The operating current of the optical amplifier GX is approximately 1.1 [A], while the operating current of the optical amplifier G is approximately 0.5 [A] which is approximately one-half that of the optical amplifier GX. In the example illustrated in FIG. 5, as the operating current decreases, the power consumption Gp1 decreases to approximately 6 [kW] as opposed to the power consumption Gp1X of approximately 12 [kW]. In addition, the supplied voltage Gv1 decreased to approximately 9 [kV] as opposed to the supplied voltage Gv1X of approximately 11 [kV].

In the example illustrated in FIG. 6, the power consumption Gp2 decreased to approximately 9 [kW] as opposed to the power consumption Gp2X of approximately 15 [kW]. In addition, the supplied voltage Gv1 increased by approximately 1 [kV] to approximately 15 [kV] as opposed to the supplied voltage Gv2X of approximately 14 [kV].

From these results, it was found that by providing the optical amplifier G according to the present embodiment, the resistance loss of the optical communication system becomes small, and the power consumption of the optical communication system can be reduced to approximately one-half that of the comparative example. It was also found that the supplied voltage decreases as opposed to the comparative example, or that an increase of the supplied voltage is slight as opposed to the comparative case, even if the increase does occur.

<Modification>

An optical amplifier Ga according to a modification will be described. In the present modification, those elements that are the same or have the same functions as the first embodiment will be designated by the same reference numerals, and a repeated description thereof will be omitted. The same also applies for other embodiments described below.

In the present modification, an optical amplifier Ga includes 3 semiconductor lasers L per two excitation cores Ce of the erbium-doped optical fiber EF.

Figure 7:
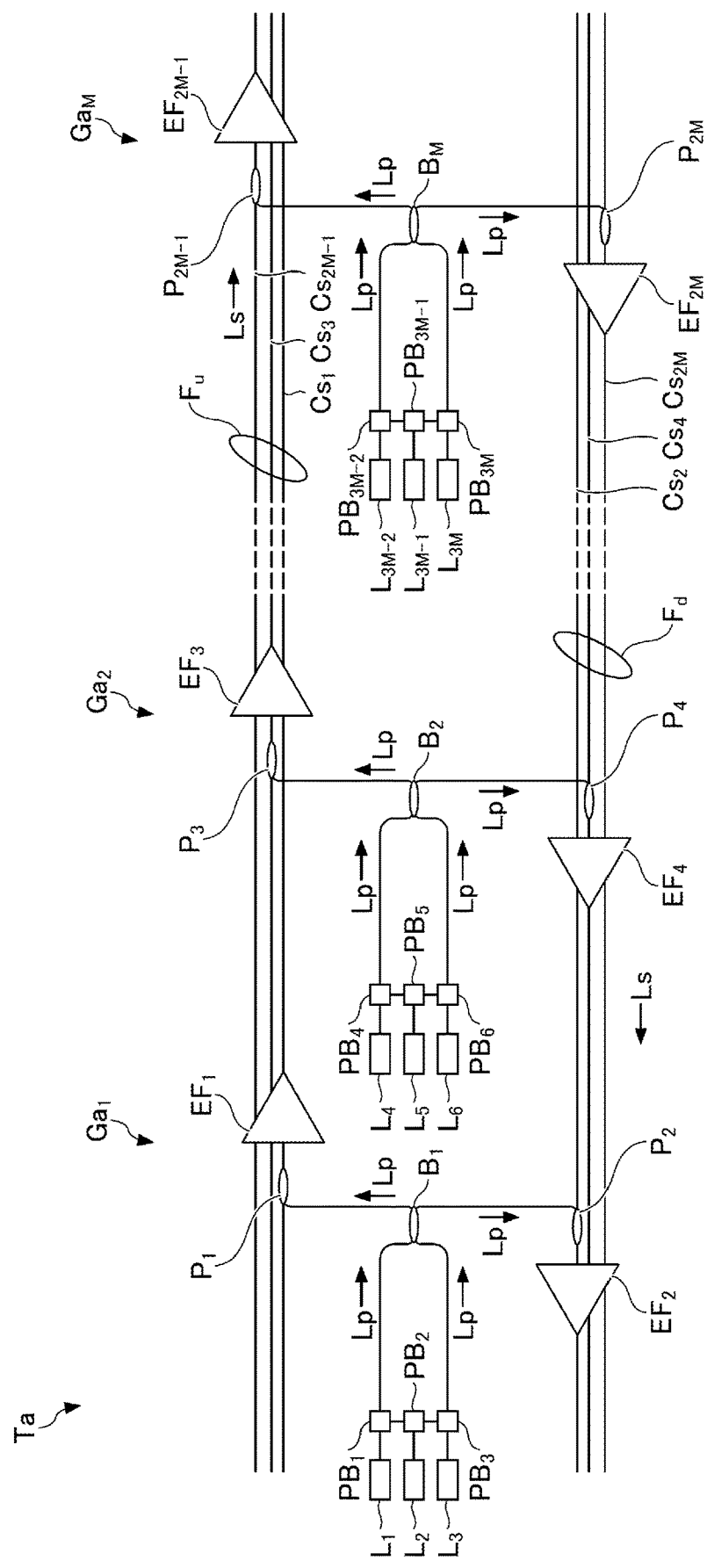
FIG. 7 is a diagram illustrating an example of the configuration of the optical amplifier according to a modification.

FIG. 7 is a diagram illustrating an example of the configuration of the optical amplifier Ga included in the repeater Ta. In FIG. 7, an optical amplifier $Ga_1$ includes the erbium-doped optical fiber $EF_1$, the erbium-doped optical fiber $EF_2$, 3 semiconductor lasers L including the semiconductor lasers $L_1$ through $L_3$, and 3 polarization elements PB including the polarization elements $PB_1$ through $PB_3$. An optical amplifier $Ga_2$ includes the erbium-doped optical fiber $EF_3$, the erbium-doped optical fiber $EF_4$, 3 semiconductor lasers L including the semiconductor lasers $L_4$ through $L_6$, and 3 polarization elements PB including the polarization elements $PB_4$ through $PB_6$. An optical amplifier $Ga_M$ includes the erbium-doped optical fiber $EF_{2M-1}$, the erbium-doped optical fiber $EF_{2M}$, 3 semiconductor lasers L including the semiconductor lasers $L_{3M-2}$ through $L_{3M}$, and 3 polarization elements PB including the polarization elements $PB_{3M-2}$ through $PB_{3M}$.

In order to amplify the signal light Ls transmitted through each of the total of 16 signal cores Cs included in the upstream optical fiber Fu and the downstream optical fiber Fd, the optical amplifier Ga includes 16 excitation cores Ce of the erbium-doped optical fibers EF. In addition, the optical amplifier Ga includes 3 semiconductor lasers L per two excitation cores Ce of the erbium-doped optical fibers EF, and thus a total of 24 semiconductor lasers L.

In the optical amplifier $Ga_1$, the excitation light Lp emitted from the semiconductor laser $L_1$ is input to the polarization element $PB_1$. The excitation light Lp emitted from the semiconductor laser $L_2$ is input to the polarization element $PB_2$. The excitation light Lp emitted from the semiconductor laser $L_3$ is input to the polarization element $PB_3$.

A portion the excitation light Lp that is emitted from the semiconductor laser $L_2$, and polarized and separated by the polarization element $PB_2$, and the excitation light Lp emitted from the semiconductor laser $L_1$, are synthesized and input to the 3 dB coupler $B_1$. Similarly, a portion of the excitation light Lp that is emitted from the semiconductor laser $L_2$, and polarized and separated by the polarization element $PB_2$, and the excitation light Lp emitted from the semiconductor laser $L_3$, are synthesized and input to the 3 dB coupler $B_1$.

The excitation light Lp emitted from the semiconductor laser $L_2$ is preferably polarized and separated by the polarization element $PB_2$ at an approximately uniform optical power, and it is particularly preferable that a difference of the optical powers of the polarizations is 1 [dB] or lower.

The 3 dB coupler $B_1$ synthesizes the two excitation light Lp input thereto, and thereafter branches the synthesized light into two so that the branching ratio is approximately 1:1. One of the two excitation light Lp branched by 3 dB coupler $B_1$ is input to the optical fiber pump multiplexer $P_1$, combined or multiplexed with the signal light Ls transmitted through the signal core $Cs_1$, and input to the excitation core $Ce_1$ of the erbium-doped optical fiber $EF_1$ together with the signal light Ls. The erbium-doped optical fiber $EF_1$ foams a population inversion by the erbium excited by the excitation light Lp, and amplifies the signal light Ls transmitted through the erbium-doped optical fiber $EF_1$.

On the other hand, the other of the two excitation light Lp branched by the 3 dB coupler $B_1$ is input to the optical fiber pump multiplexer $P_2$, combined or multiplexed with the signal light Ls transmitted through the signal core $Cs_2$, and input to the excitation core $Ce_2$ of the erbium-doped optical fiber $EF_2$ together with the signal light Ls. The erbium-doped optical fiber $EF_2$ foams a population inversion by the erbium excited by the excitation light Lp, and amplifies the signal light Ls transmitted through erbium-doped optical fiber $EF_2$.

Similarly, the optical amplifier $Ga_2$ amplifies the signal light Ls transmitted through the signal core $Cs_3$ and the signal core $Cs_4$, by the excitation light Lp emitted from each of the semiconductor lasers L including the semiconductor lasers $L_4$ through $L_6$. The optical amplifier $Ga_M$ amplifies the signal light Ls transmitted through the signal core $Cs_{2M-1}$ and the signal core $Cs_{2M}$, by the excitation light Lp emitted from each of the semiconductor lasers L including the semiconductor lasers $L_{3M-2}$ through $L_{3M}$.

The configuration and function of the optical amplifiers $Ga_2$ through $Ga_M$ are the same as the configuration and function of the optical amplifier $Ga_1$, except for the different signal cores Cs that are targets of the optical amplification.

The driving circuits for driving the semiconductor lasers L included in the optical amplifier Ga are the same as the driving circuits D illustrated in FIG. 4, except for the number of driving circuits that is 3M according to the number of the semiconductor lasers L.

Accordingly, the optical amplifier Ga drives 3 semiconductor lasers L together by the driving currents I, and excites two excitation cores Ce by the excitation light Lp in which the excitation light Lp emitted from each of the 3 semiconductor lasers L are synthesized. As a result, the optical amplifier Ga can make the driving current I approximately $\frac{2}{3}$ compared to the case where one excitation core is excited by the excitation light emitted from one semiconductor laser. By reducing the driving current I, it is possible to provide an optical amplifier having a low operating current.

In the first embodiment, the excitation light Lp emitted from 4 semiconductor lasers L per two excitation cores Ce are synthesized and input in the example of the configuration illustrated. On the other hand, in the present modification, the excitation light Lp emitted from 3 semiconductor lasers L per two excitation cores Ce are synthesized and input in the example of the configuration illustrated, but the configuration of the present modification is not limited to such. The number of excitation cores Ce and the number of semiconductor lasers L are not particularly limited, as long as two or more excitation cores Ce are provided in total, the excitation light emitted from two or more semiconductor lasers L per single core Ce are synthesized and input with respect to each of the excitation cores Ce.

Second Embodiment

An optical amplifier Gb according to a second embodiment will be described. In the present embodiment, the optical amplifier Gb synthesizes the excitation light Lp emitted from two or more semiconductor lasers L per single excitation core Ce according to the light injection synchronization method.

Figure 8:
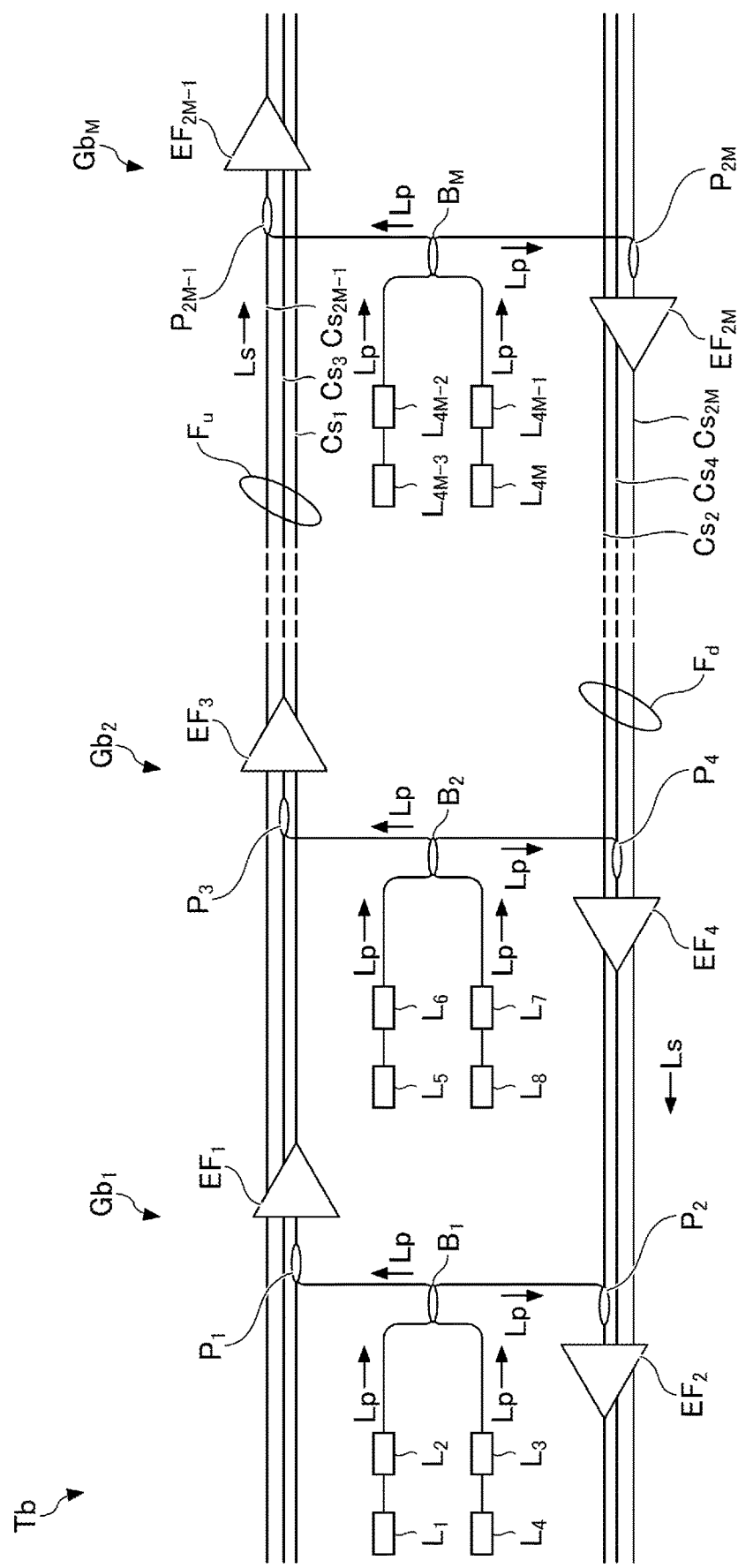
FIG. 8 is a diagram illustrating an example of the configuration of the optical amplifier according to a second embodiment.

FIG. 8 is a diagram illustrating an example of the configuration of the optical amplifier Gb included in a repeater Tb. In FIG. 8, an optical amplifier $Gb_1$ includes the erbium-doped optical fiber $EF_1$, the erbium-doped optical fiber $EF_2$, and 4 semiconductor lasers L including the semiconductor lasers $L_1$ through $L_4$. Among the semiconductor lasers $L_1$ through $L_4$, the semiconductor laser $L_1$ and the semiconductor laser $L_2$ are connected in series, and the semiconductor laser $L_3$ and the semiconductor laser $L_4$ are connected in series.

An optical amplifier $Gb_2$ includes the erbium-doped optical fiber $EF_3$, the erbium-doped optical fiber $EF_4$, and 4 semiconductor lasers L including the semiconductor lasers $L_5$ through $L_8$. Among the semiconductor lasers $L_5$ through $L_8$, the semiconductor laser $L_5$ and the semiconductor laser $L_6$ are connected in series, and the semiconductor laser $L_7$ and the semiconductor laser $L_8$ are connected in series.

An optical amplifier $Gb_M$ includes the erbium-doped optical fiber $EF_{2M-1}$, the erbium-doped optical fiber $EF_{2M}$, and 4 semiconductor lasers L including the semiconductor lasers $L_{4M-3}$ through $L_{4M}$. Among the semiconductor lasers $L_{4M-3}$ through $L_{4M}$, the semiconductor laser $L_{4M-3}$ and the semiconductor laser $L_{4M-2}$ are connected in series, and the semiconductor laser $L_{4M-1}$ and the semiconductor laser $L_{4M}$ are connected in series.

In order to amplify the signal light Ls transmitted through each of the total of 16 signal cores Cs included in the upstream optical fiber Fu and the downstream optical fiber Fd, the optical amplifier Gb includes 16 excitation cores Ce of the erbium-doped optical fibers EF. In addition, the optical amplifier Gb includes two semiconductor lasers L per single excitation core Ce of the erbium-doped optical fibers EF, and thus a total of 32 semiconductor lasers L.

In the optical amplifier $Ga_1$, when the excitation light Lp emitted from the semiconductor laser $L_1$ is input to the semiconductor laser $L_2$ that is self-oscillating, the light injection synchronization phenomenon occurs in which the oscillation wavelength of the semiconductor laser $L_2$ is synchronized to the wavelength of the input excitation light Lp. In addition, the excitation light Lp emitted from the semiconductor laser $L_1$ and the excitation light Lp emitted from the semiconductor laser $L_2$ are synthesized, and the synthesized excitation light Lp is input to the 3 dB coupler $B_1$.

Similarly, when the excitation light Lp emitted from the semiconductor laser $L_4$ is input to the semiconductor laser $L_3$ that is self-oscillating, the light injection synchronization phenomenon occurs in which the oscillation wavelength of the semiconductor laser $L_3$ is synchronized to the wavelength of the input excitation light Lp. In addition, the excitation light Lp emitted from the semiconductor laser $L_4$ and the excitation light Lp emitted from the semiconductor laser $L_3$ are synthesized, and the synthesized excitation light Lp is input to the 3 dB coupler $B_1$.

The 3 dB coupler $B_1$ synthesizes the two excitation light Lp input thereto, and thereafter branches the synthesized light into two so that the branching ratio is approximately 1:1. One of the branched excitation light Lp is input to the excitation core $Ce_1$ of the erbium-doped optical fiber $EF_1$ through the optical fiber pump multiplexer $P_1$ to excite the erbium, so as to amplify the signal light Ls transmitted through the signal core $Cs_1$. The other of the branched excitation light Lp is input to the excitation core $Ce_2$ of the erbium-doped optical fiber $EF_2$ through the optical fiber pump multiplexer $P_2$ to excite the erbium, so as to amplify the signal light Ls transmitted through the signal core $Cs_2$.

Similarly, the optical amplifier $Gb_2$ amplifies the signal light Ls transmitted through the signal core $Cs_3$ and the signal core $Cs_4$ by the excitation light Lp emitted from each of the semiconductor lasers L including the semiconductor lasers $L_5$ through $L_8$. The optical amplifier $Gb_M$ amplifies the signal light Ls transmitted through the signal core $Cs_{2M-1}$ and the signal core $Cs_{2M}$ by the excitation light Lp emitted from each of the semiconductor lasers L including the semiconductor lasers $L_{4M-3}$ through $L_{4M}$.

The configuration and function of the optical amplifiers $Gb_2$ through $Gb_M$ are the same as the configuration and function of the optical amplifier $Gb_1$, except for the different signal cores Cs that are targets of the optical amplification.

The driving circuits for driving the semiconductor lasers L included in the optical amplifier Gb are the same as the driving circuits D illustrated in FIG. 4.

As described above, the optical amplifier Gb synthesizes the excitation light Lp emitted from each of the two or more semiconductor lasers L per single excitation core Ce according to the light injection synchronization method. For this reason, it is possible to reduce the driving current I, and provide an optical amplifier having a low operating current.

Third Embodiment

An optical amplifier Gc according to a third embodiment will be described. In the present embodiment, two or more semiconductor lasers Lc per single excitation core Ce is formed by a plurality of semiconductor laser groups LG each including a plurality of semiconductor lasers Lc connected in series. The plurality of semiconductor lasers Lc included in the semiconductor laser group LG are driven by a common driving current. The semiconductor laser group LG is a generic representation for a plurality of semiconductor laser groups.

Figure 9:
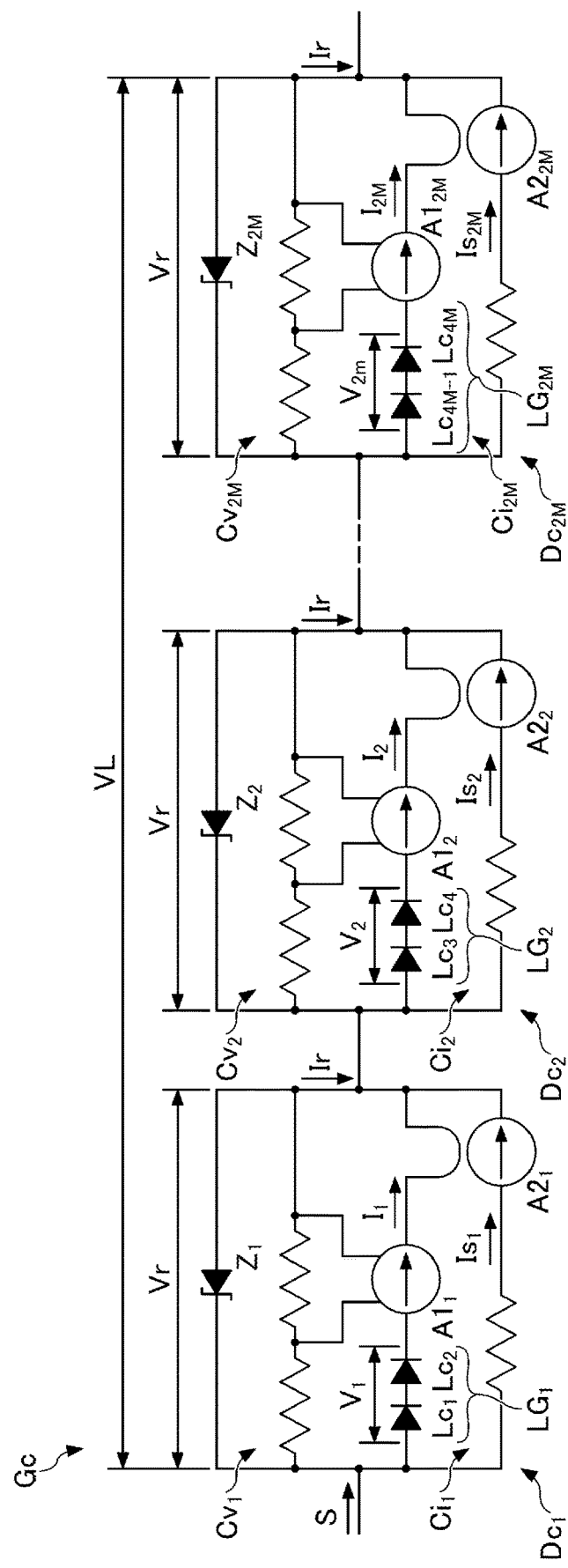
FIG. 9 is an equivalent circuit diagram of the semiconductor laser driving circuit of the optical amplifier according to a third embodiment.

FIG. 9 is an equivalent circuit diagram illustrating an example of a configuration of a driving circuit Dc for driving the semiconductor laser Lc included in the optical amplifier Gc. The 32 semiconductor lasers Lc including semiconductor laser $Lc_1$ through $Lc_{4M}$ are formed by 16 semiconductor laser groups LG including semiconductor laser groups $LG_1$ through $LG_{2M}$, where M=8.

The optical amplifier Gc includes 16 driving circuits Dc including driving circuits $Dc_1$ through $Dc_{2M}$ for driving 16 semiconductor laser groups LG including semiconductor laser groups $LG_1$ through $LG_{2M}$. The driving circuits $Dc_1$ through $Dc_{2M}$ are connected in series. The driving circuits $Dc_1$ through $Dc_{2M}$ drive and cause emission from each of the semiconductor lasers Lc including semiconductor lasers $Lc_1$ through $Lc_{4M}$, according to the driving current I that is at least a portion of the operating current S supplied from the first power supply device 10.

Each of the 16 semiconductor laser groups LG includes two semiconductor lasers Lc connected in series. More particularly, the semiconductor laser group $LG_1$ includes the semiconductor laser $Lc_1$ and the semiconductor laser $Lc_2$ connected in series. The semiconductor laser $Lc_1$ and the semiconductor laser $Lc_2$ are driven by a common driving current $I_1$. The semiconductor laser group $LG_2$ includes the semiconductor laser $Lc_3$ and the semiconductor laser $Lc_4$ connected in series. The semiconductor laser $Lc_3$ and the semiconductor laser $Lc_4$ are driven by a common driving current $I_2$. The semiconductor laser group $LG_{2M}$ includes the semiconductor laser $Lc_{4M-1}$ and the semiconductor laser $Lc_{4M}$ connected in series. The semiconductor laser $Lc_{4M-1}$ and the semiconductor laser $Lc_{4M}$ are driven by a common driving current $I_{2M}$.

The configuration and function of the driving circuit Dc, other than the configuration of the semiconductor laser Lc, are the same as the configuration and function of the driving circuit D of the first embodiment described above.

By driving two semiconductor lasers Lc with a common driving current I, the optical amplifier Gc can reduce the number of driving circuits Dc for driving two semiconductor lasers Lc per single excitation core Ce, and reduce the number of current sources A1, compared to the optical amplifier G according to the first embodiment. Hence, the optical amplifier Gc can reduce the voltage drop, and reduce the operating current of the optical amplifier Gc. In addition, the optical amplifier Gc can make the area in which the driving circuits Dc are disposed small, by reducing the number of driving circuits Dc. Other effects obtainable in the present embodiment are the same as those obtainable in the first embodiment.

The number of semiconductor lasers Lc forming the semiconductor laser group LG is not limited to two, and may be 3 or more. Further, the driving circuit Dc is applicable to the optical amplifier Ga and the optical amplifier Gb, respectively. In a case where the driving circuit Dc is applied to the optical amplifier Ga, 3 semiconductor lasers Lc are provided in one driving circuit Dc, for example.

Fourth Embodiment

An optical amplifier Gd according to a fourth embodiment will be described. In the present embodiment, the optical amplifier Gd synthesizes the excitation light Lp emitted from two or more semiconductor lasers Ld per single excitation core Ce according to the complex resonator method.

Figure 10:
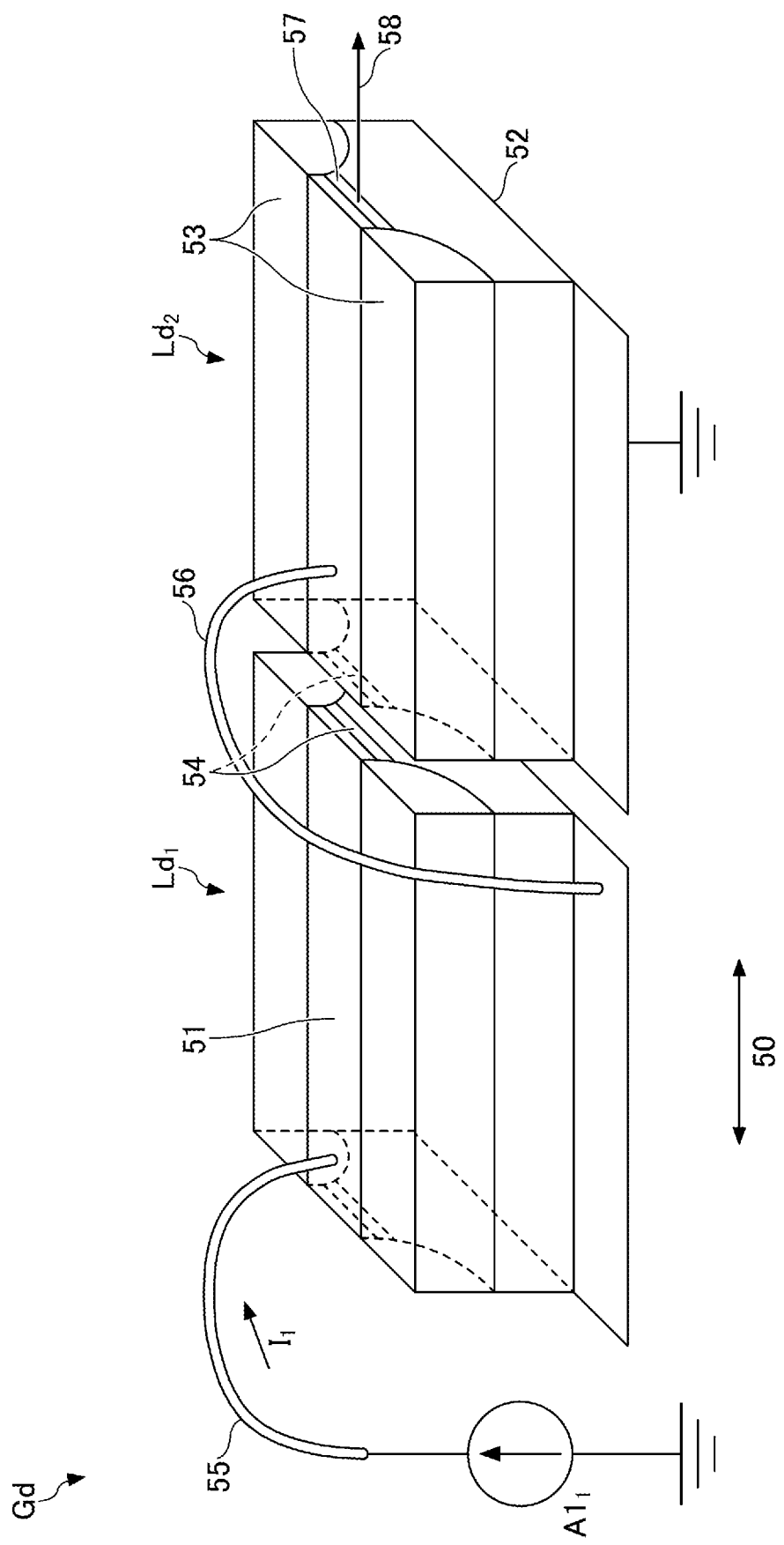
FIG. 10 is a diagram illustrating an example of a semiconductor laser of the optical amplifier according to a fourth embodiment.

FIG. 10 is a diagram illustrating a semiconductor laser $Ld_1$ and a semiconductor laser $Ld_2$ among a plurality of semiconductor lasers Ld included in the optical amplifier Gd.

As illustrated in FIG. 10, the semiconductor laser $Ld_1$ and the semiconductor laser $Ld_2$ are cascaded along a resonance direction 50, and form a complex resonator. The semiconductor laser $Ld_1$ and the semiconductor laser $Ld_2$ include an upper electrode 51, a lower electrode 52, and a current block layer 53 on the lower electrode 52 at a position close to the upper electrode 51. In addition, the semiconductor laser $Ld_1$ and the semiconductor laser $Ld_2$ include an antireflection film 54 on respective first end surfaces where the semiconductor laser $Ld_1$ and the semiconductor laser $Ld_2$ oppose each other. In each of the semiconductor laser $Ld_1$ and the semiconductor laser $Ld_2$, a reflecting surface is provided on respective second end surfaces of the semiconductor laser $Ld_1$ and the semiconductor laser $Ld_2$, opposite to the first end surfaces. The upper electrode 51 is connected to the current source $A1_1$ via a wiring 55.

The driving current $I_1$ is supplied from current source $A1_1$ to the semiconductor laser $Ld_1$ through the wiring 55 and the upper electrode 51. The driving current $I_1$ flows through the semiconductor laser $Ld_1$, and is then supplied to the semiconductor laser $Ld_2$ through a wiring 56. In other words, the common driving current $I_1$ is supplied to the semiconductor laser $Ld_1$ and the semiconductor laser $Ld_2$.

The semiconductor laser $Ld_1$ and the semiconductor laser $Ld_2$ cause the light emitted due to the driving current $I_1$ flowing through respective active layers 57 thereof to oscillate along the resonance direction 50 within the active layer 57, so as to emit laser light by stimulated emission. The semiconductor laser $Ld_1$ and the semiconductor laser $Ld_2$ output the laser light in which laser light emitted therefrom are synthesized, as the excitation light Lp, in an output direction 58.

The current block layer 53 is provided to trap light within the active layer 57, for example. The antireflection film 54 is provided to prevent reflection at an interface between the semiconductor laser $Ld_1$ and the semiconductor laser $Ld_2$ when the light oscillates within the active layer 57 along the resonance direction 50, in order to increase an oscillation efficiency of the laser light.

The driving circuit Dc illustrated in FIG. 9 can be applied to the driving circuit in the optical amplifier Gd. In this case, the semiconductor laser $Ld_1$ illustrated in FIG. 10 corresponds to the semiconductor laser $Lc_1$ illustrated in FIG. 9, and the semiconductor laser $Ld_2$ illustrated in FIG. 10 corresponds to the semiconductor laser $Lc_2$ illustrated in FIG. 9.

Among the plurality of semiconductor lasers Ld included in the optical amplifier Gd, the configuration and function of the semiconductor lasers Ld, other than the semiconductor laser $Ld_1$ and the semiconductor laser $Ld_2$, are the same as the configuration and function of the semiconductor laser $Ld_1$ and the semiconductor laser $Ld_2$.

As described above, the optical amplifier Gd synthesizes the excitation light Lp emitted from two or semiconductor lasers Ld per single excitation core Ce according to the complex resonator method. Accordingly, it is possible to reduce the driving current I, and provide an optical amplifier having a low operating current.

In addition, the optical amplifier Gd can reduce the number of the driving circuit Dc for supplying the driving current to the two semiconductor lasers Ld per single excitation core Ce and reduce the number of current sources A1, compared to the optical amplifier G according to the first embodiment, by driving the two semiconductor lasers Ld by the common driving current I. Hence, the optical amplifier Gd can reduce the voltage drop, and reduce the operating current of the optical amplifier Gd. In addition, the optical amplifier Gd can make the area in which the driving circuits are disposed small, by reducing the number of driving circuits. Other effects obtainable in the present embodiment are the same as those obtainable in the first embodiment.

Although the present embodiment synthesizes the excitation light Lp according to the complex resonator method in this example, the MOPA method may be applied in place of the complex resonator method. In a case where the MOPA method is applied, the semiconductor laser $Ld_1$ illustrated in FIG. 10 corresponds to a first oscillator, and the semiconductor laser $Ld_2$ illustrated in FIG. 10 corresponds to a second oscillator. The first oscillator is a high stability oscillator for generating high quality beam, for example. The second oscillator is a high power oscillator, for example. High output excitation light Lp in which the excitation light Lp emitted from the semiconductor laser $Ld_1$ and the excitation light Lp emitted from the semiconductor laser $Ld_2$ are synthesized, is extracted along the output direction 58 from the semiconductor laser $Ld_2$.

Fifth Embodiment

An optical amplifier Ge according to a fifth embodiment will be described. In the present embodiment, a portion of two or more semiconductor lasers Le per single excitation core Ce includes the semiconductor laser group LG including a plurality of semiconductor lasers Le connected in series. Other portions of two or more semiconductor lasers Le per single excitation core Ce include semiconductor lasers that are not connected in series, that is, the semiconductor lasers other than the semiconductor lasers Le of the semiconductor laser group LG. The plurality of semiconductor lasers Le included in the semiconductor laser group LG are driven by a common driving current.

The configuration of the optical amplifier Ge may be the same as the configuration of the optical amplifier Ga included in the repeater Ta illustrated in FIG. 7.

Figure 11:
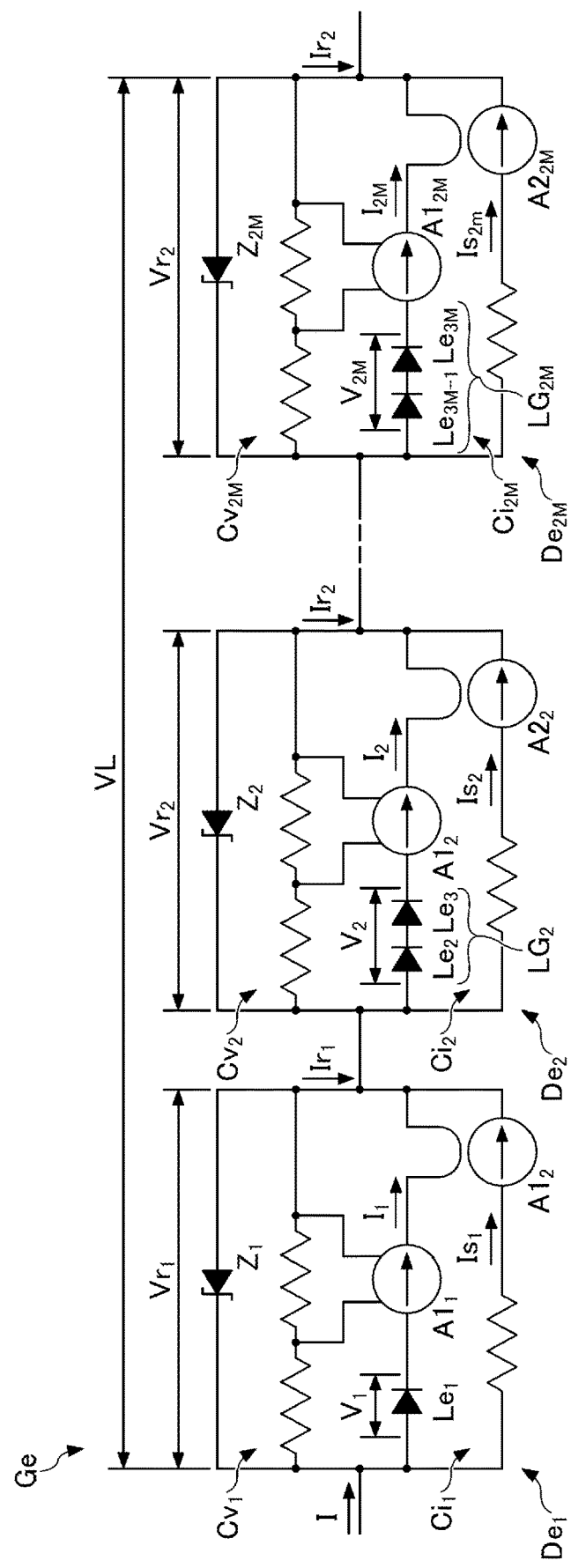
FIG. 11 is an equivalent circuit diagram of the semiconductor laser driving circuit of the optical amplifier according to a fifth embodiment.

FIG. 11 is an equivalent circuit diagram illustrating an example of a configuration of a driving circuit De for driving the semiconductor laser Le included in the optical amplifier Ge. Driving circuits $De_1$ through $De_{2M}$ are connected in series. The driving circuits $De_1$ through $De_{2M}$ drive and cause emission from each of semiconductor lasers Le including the semiconductor lasers $Le_1$ through $Le_{4M}$, according to the driving current I that is at least a portion of the operating current S supplied from the first power supply device 10.

One semiconductor laser Le is provided in the odd-numbered driving circuits De among the driving circuits $De_1$ through $De_{2M}$. The semiconductor laser group LG including two semiconductor lasers Le connected in series is provided in the even-numbered driving circuit De among the driving circuits $De_1$ through $De_{2M}$.

More particularly, one semiconductor laser $Le_1$ is provided in the driving circuit $De_1$. The semiconductor laser group $LG_2$, including the semiconductor laser $Le_2$ and the semiconductor laser $Le_3$ that are connected in series, is provided in the driving circuit $De_2$. The semiconductor laser Le$_2$ and the semiconductor laser Le$_3$ are driven by a common driving current I$_2$. The semiconductor laser group LG$_{2M}$, including the semiconductor laser Le$_{3M-1}$ and the semiconductor laser Le$_{3M}$ that are connected in series, is provided in the driving circuit De$_{2M}$. The semiconductor laser Le$_{3M-1}$ and the semiconductor laser Le$_{3M}$ are driven by the common driving current I$_2$.

The configuration and function of the driving circuit De are the same as the configuration and function of the driving circuit D of the first embodiment described above, except for the configuration of the semiconductor laser Le.

As described above, the optical amplifier Ge drives the 3 semiconductor lasers Le together with the driving current I, and excites the two excitation cores Ce by the excitation light Lp in which the excitation light Lp emitted from each of the 3 semiconductor lasers Le are synthesized. For this reason, the optical amplifier Ge can make the driving current I approximately ⅔ compared to the case where the excitation core is excited by the excitation light emitted from one semiconductor laser. By reducing the driving current I, it is possible to provide an optical amplifier having a low operating current.

In addition, the optical amplifier Ge can reduce the number of driving circuits De for supplying the driving currents to the 3 semiconductor lasers Le per two excitation cores Ce and reduce the number of current sources A1, compared to the optical amplifier G according to the first embodiment, by driving the two semiconductor lasers Le among the 3 semiconductor lasers Le by the common driving current I. Accordingly, the optical amplifier Ge can reduce the voltage drop, and make the operating current of the optical amplifier Ge small. Further, the optical amplifier Ge can make the area in which the driving circuit De are disposed small, by reducing the number of driving circuits De. Other effects obtainable in the present embodiment are the same as those obtainable in the first embodiment.

Sixth Embodiment

An optical amplifier Gf according to the sixth embodiment will be described. In the present embodiment, two or more semiconductor lasers Lf per single excitation core Ce include the semiconductor laser group LG including a plurality of semiconductor lasers Lf connected in series. The two or more semiconductor lasers Lf per single excitation core Ce do not include semiconductor lasers other than the semiconductor lasers Lf of the semiconductor laser group LG. The plurality of semiconductor lasers Lf included in the semiconductor laser group LG are driven by a common driving current. In addition, the optical amplifier Gf includes 3 semiconductor lasers Lf per two excitation cores Ce of the erbium-doped optical fiber EF, and the excitation light Lp emitted from each of the 3 semiconductor lasers Lf are synthesized according to the light injection synchronization method.

Figure 12:
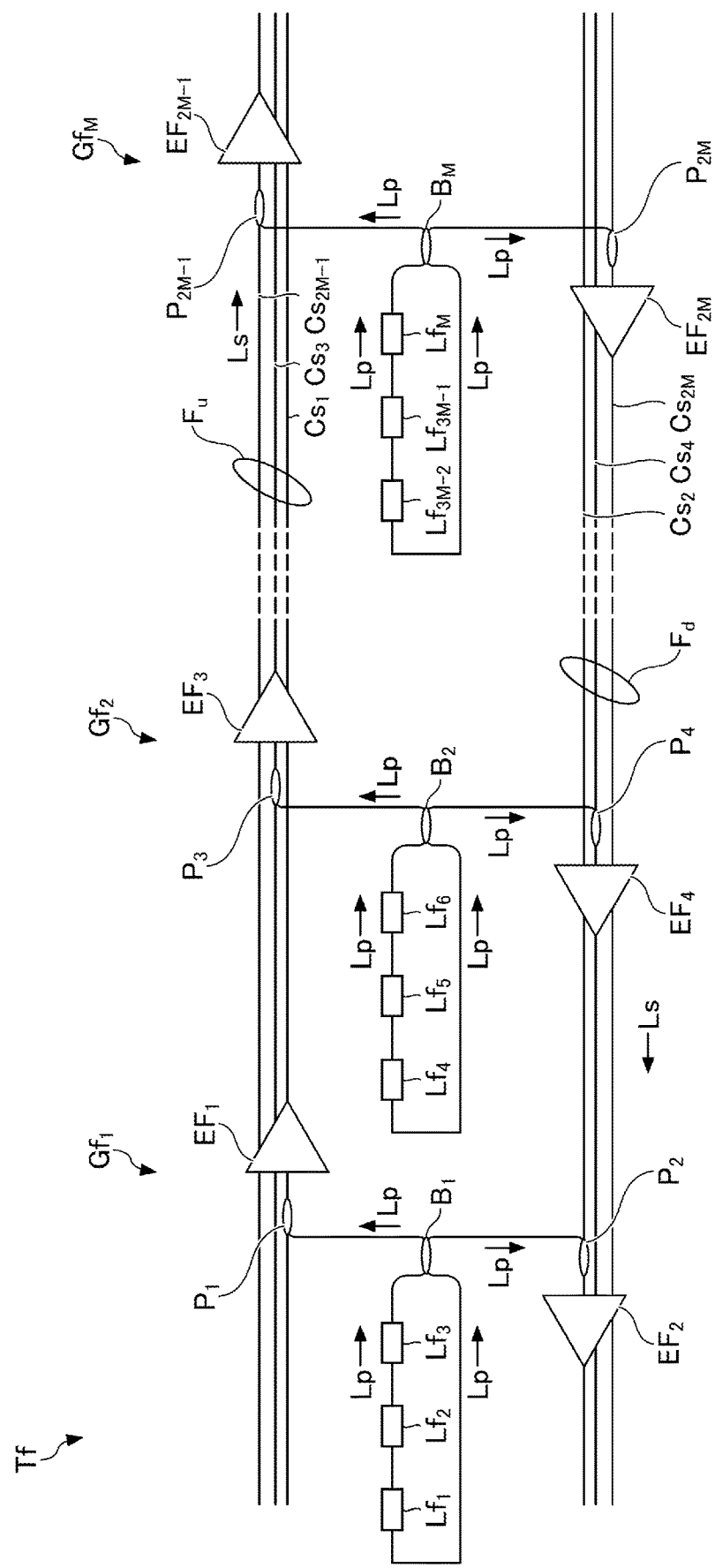
FIG. 12 is a diagram illustrating an example of the configuration of the optical amplifier according to a sixth embodiment.

FIG. 12 is a diagram illustrating an example of the configuration of the optical amplifier Gf included in the repeater Tf.

In FIG. 12, an optical amplifier Gf$_1$ includes the erbium-doped optical fiber EF$_1$, the erbium-doped optical fiber EF$_2$, and 3 semiconductor lasers Lf including the semiconductor lasers Lf$_1$ through Lf$_3$. The semiconductor lasers Lf$_1$ through Lf$_3$ are connected in series.

An optical amplifier Gf$_2$ includes the erbium-doped optical fiber EF$_3$, the erbium-doped optical fiber EF$_4$, and 3 semiconductor lasers Lf including the semiconductor lasers Lf$_4$ through Lf$_6$. The semiconductor lasers Lf$_4$ through Lf$_6$ are connected in series.

An optical amplifier Gf$_M$ includes the erbium-doped optical fiber EF$_{2M-1}$, the erbium-doped optical fiber EF$_{2M}$, and 3 semiconductor lasers Lf including the semiconductor lasers Lf$_{3M-2}$ through Lf$_{3M}$. The semiconductor lasers Lf$_{3M-2}$ through Lf$_{3M}$ are connected in series.

The optical amplifier Gf includes 16 excitation cores Ce of the erbium-doped optical fiber EF. The optical amplifier Gf includes 3 semiconductor lasers Lf per two excitation cores Ce of the erbium-doped optical fibers EF, and thus a total of 24 semiconductor lasers Lf.

In the optical amplifier Gf$_1$, when the excitation light Lp emitted from the semiconductor laser Lf$_2$ is input to the self-oscillating semiconductor laser Lf$_1$, the light injection synchronization phenomenon occurs in which the oscillation wavelength of the semiconductor laser Lf$_1$ is synchronized to the wavelength of the input excitation light Lp. In addition, the excitation light Lp emitted from the semiconductor laser Lf$_2$ and the excitation light Lp emitted from the semiconductor laser Lf$_1$ are synthesized, and the synthesized excitation light Lp is input to the 3 dB coupler B$_1$.

Similarly, when the excitation light Lp emitted from the semiconductor laser Lf$_2$ is input to the self-oscillating semiconductor laser Lf$_3$, the light injection synchronization phenomenon occurs in which the oscillation wavelength of the semiconductor laser Lf$_3$ is synchronized to the wavelength of the input excitation light Lp. In addition, the excitation light Lp emitted from the semiconductor laser Lf$_2$ and the excitation light Lp emitted from the semiconductor laser Lf$_3$ are synthesized, and the synthesized excitation light Lp is input to the 3 dB coupler B$_1$.

The optical powers input from the semiconductor lasers Lf$_2$ to each of the semiconductor lasers Lf$_1$ and Lf$_3$ are preferably approximately uniform. It is particularly preferable that the difference of the optical powers input to the two semiconductor lasers Lf$_1$ and Lf$_3$ is 1 [dB] or lower.

The 3 dB coupler B$_1$ synthesizes the two excitation light Lp input thereto, and thereafter branches the synthesized light into two so that the branching ratio is approximately 1:1. One of the branched excitation light Lp is input to the excitation core Ce$_1$ of the erbium-doped optical fiber EF$_1$ through the optical fiber pump multiplexer P$_1$. The other of the branched excitation light Lp is input to the excitation core Ce$_2$ of the erbium-doped optical fiber EF$_2$ via the optical fiber pump multiplexer P$_2$. The optical amplifier Gf$_1$ amplifies the signal light Ls transmitted through the signal core Cs$_1$ and the signal core Cs$_2$, respectively, by exciting the erbium by the excitation light Lp.

Similarly, the optical amplifier Gf$_2$ amplifies the signal light Ls transmitted through the signal core Cs$_3$ and the signal core Cs$_4$, respectively, by the excitation light Lp emitted from each of the semiconductor lasers Lf including the semiconductor lasers Lf$_4$ through Lf$_6$. The optical amplifier Gf$_M$ amplifies the signal light Ls transmitted through the signal core Cs$_{2M-1}$ and the signal core Cs$_{2M}$, respectively, by the excitation light Lp emitted from each of the semiconductor lasers Lf including the semiconductor lasers Lf$_{3M-3}$ through Lf$_{3M}$.

The optical amplifiers Gf$_2$ through Gf$_M$ have the same configuration and function as the optical amplifier Gf$_1$, except for the different signal cores Cs that are targets of the optical amplification.

The driving circuit De illustrated in FIG. 11 can be applied to the driving circuit for driving the semiconductor laser Lf provided in the optical amplifier Gf.

As described above, by synthesizing the excitation light Lp emitted from each of the 3 semiconductor lasers Lf per two excitation cores Ce according to the light injection synchronization method, the optical amplifier Gf can reduce the driving current I, and provide an optical amplifier having a low operating current. In addition, the optical amplifier Gf can reduce the voltage drop, and make the operating current of the optical amplifier Ge small, while simultaneously making the area in which the driving circuit De is disposed small.

Although the present embodiment synthesizes the excitation light Lp according to the light injection synchronization method, the complex resonator method or the MOPA method may be applied in place of the light injection synchronization method. In addition, the optical amplifier Gf may synthesize the excitation light Lp by a combination of at least two of the synchronization methods selected from the polarization synthesizing method, the light injection synchronization method, the complex resonator method, and the MOPA method.

While embodiments and modifications have been described, the embodiments and modifications disclosed herein are exemplary in all respects and are non-limiting. Various variations, modification, substitutions, or the like may be made without departing from the scope of the present invention set forth in the appended claims and equivalents thereof, for example.

In the embodiments described above, the optical communication system is described as an optical submarine cable system, but the optical communication system is not limited thereto. The embodiments are also applicable to optical communication systems other than optical submarine cable system.

The ordinal numbers, quantities, or the like used in the description of the embodiments are all exemplary for purposes of describing specific examples, and the present invention is not limited to the exemplary numbers, quantities, or the like.

According to the present disclosure, it is possible to provide an optical amplifier having a low operating current.

Although the embodiments are numbered with, for example, "first," "second," "third," "fourth," "fifth," or "sixth," the ordinal numbers do not imply priorities of the embodiments. Many other variations and modifications will be apparent to those skilled in the art.

While the embodiments have been described, it will be understood that various variations, modifications, and substitutions may be made without departing from the spirit and scope of the present disclosure. Hence, combinations and substitutions of a part or all of each embodiment with another embodiment may be made, as appropriate.

What is claimed is:

1. An optical amplifier comprising:
one or more rare earth element-doped optical fibers each including one or more cores;
two or more excitation light sources per single core of the one or more rare earth element-doped optical fibers, configured to emit excitation light for exciting a rare earth element added to the one or more rare earth element-doped optical fibers according to a driving current; and
a synthesizing part configured to synthesize the excitation light emitted from the two or more excitation light sources per single core, wherein:
two or more cores are provided in total,
the two or more excitation light sources per single core are driven by driving currents supplied from a plurality of driving circuits coupled in series, and
the excitation light emitted from the two or more excitation light sources per single core is synthesized and input with respect to each core.

2. The optical amplifier as claimed in claim 1, wherein at least a portion of the two or more excitation light sources per single core includes a semiconductor laser group including a plurality of semiconductor lasers coupled in series, and
the plurality of semiconductor lasers included in the semiconductor laser group are driven by a common driving current.

3. The optical amplifier as claimed in claim 1, wherein the one or more rare earth element-doped optical fibers are multicore optical fibers having a plurality of cores covered with a single cladding.

4. The optical amplifier as claimed in claim 3, wherein a power coupling coefficient between adjacent cores among the plurality of cores is 10 [/m] or higher.

5. An optical communication system comprising:
one or more optical fibers configured to transmit optical signals; and
the optical amplifier as claimed in claim 4, configured to amplify the optical signals transmitted through the one or more optical fibers.

6. An optical communication system comprising:
one or more optical fibers configured to transmit optical signals; and
the optical amplifier as claimed in claim 3, configured to amplify the optical signals transmitted through the one or more optical fibers.

7. An optical communication system comprising:
one or more optical fibers configured to transmit optical signals; and
the optical amplifier as claimed in claim 2, configured to amplify the optical signals transmitted through the one or more optical fibers.

8. An optical communication system comprising:
one or more optical fibers configured to transmit optical signals; and
the optical amplifier as claimed in claim 1, configured to amplify the optical signals transmitted through the one or more optical fibers.

9. An optical amplifier comprising:
one or more rare earth element-doped optical fibers each including one or more cores;
two or more excitation light sources per single core of the one or more rare earth element-doped optical fibers, configured to emit excitation light for exciting a rare earth element added to the one or more rare earth element-doped optical fibers according to a driving current; and
a synthesizing part configured to synthesize the excitation light emitted from the two or more excitation light sources per single core, wherein:
two or more cores are provided in total,
the excitation light emitted from the two or more excitation light sources per single core is synthesized and input with respect to each core,
the composite portion synthesizes the excitation light emitted from the two or more excitation light sources per single core according to at least one of a polarization synthesizing method, a light injection synchronization method, a complex resonator method, and a master oscillator power amplifier method, the polarization synthesizing method is a method of synthesizing a plurality of different polarizations using a polarization element, the light injection synchronization method is a method of synthesizing a plurality of different light, using a light injection synchronization phenomenon in which an oscillation wavelength of a self-oscillating semiconductor laser of an excitation light source is synchronized to a wavelength of external light, when the external light having the wavelength close to the oscillation wavelength is input to the self-oscillating semiconductor laser, the complex resonator method is a method of synthesizing a plurality of different light, using a complex resonator having a plurality of resonators, the master oscillator power amplifier method is a method of synthesizing a plurality of different light, using a master oscillator power amplifier, and the master oscillator power amplifier extracts, from a second oscillator, light in which light emitted from the a oscillator and the second oscillator are synthesized.

10. An optical communication system comprising:

one or more optical fibers configured to transmit optical signals; and the optical amplifier as claimed in claim 9, configured to amplify the optical signals transmitted through the one or more optical fibers.

* * * * *